United States Patent
Toda et al.

(10) Patent No.: US 6,809,390 B2
(45) Date of Patent: Oct. 26, 2004

(54) SEMICONDUCTOR CHIP MOUNTING SUBSTRATE, ELECTROOPTICAL DEVICE, LIQUID-CRYSTAL DEVICE, ELECTROLUMINESCENT DEVICE, AND ELECTRONIC EQUIPMENT

(75) Inventors: Takatomo Toda, Toyoshina-machi (JP); Naoki Makino, Matsumato (JP)

(73) Assignee: Seiko Epson Corporation (JP)

( * ) Notice: Subject to any disclaimer, the term of this patent is extended or adjusted under 35 U.S.C. 154(b) by 160 days.

(21) Appl. No.: 09/999,207

(22) Filed: Nov. 30, 2001

(65) Prior Publication Data

US 2002/0088984 A1 Jul. 11, 2002

(30) Foreign Application Priority Data

Nov. 30, 2000 (JP) ........................................ 2000-365715
Oct. 15, 2001 (JP) ........................................ 2001-317142

(51) Int. Cl.[7] ...................... H01L 31/0203; G09G 3/36; G03H 1/04
(52) U.S. Cl. .............................. 257/434; 345/98; 359/58
(58) Field of Search ................................. 257/432, 434, 257/446; 349/122, 151, 152; 354/98; 359/58

(56) References Cited

FOREIGN PATENT DOCUMENTS

| JP | 04-93826 | 8/1992 |
|----|----------|--------|
| JP | 08-095075 A | 4/1996 |
| JP | 09-304787 | 11/1997 |
| JP | 11-052405 | 2/1999 |
| JP | 2000-275666 | 10/2000 |
| JP | 2000-284261 A | 10/2000 |
| JP | 2000-284261 | 10/2000 |

OTHER PUBLICATIONS

Communication from Japanese Patent Office re counterpart application.

Communication from Korean Patent Office re counterpart application.

Primary Examiner—Amir Zarabian
Assistant Examiner—Kiesha Rose
(74) Attorney, Agent, or Firm—Harness, Dickey & Pierce, P.L.C.

(57) ABSTRACT

Disclosed is a semiconductor chip mounting substrate 4a bearing semiconductor chips 19a and 19b thereof. The first substrate 4a includes a power source line 22 for supplying a supply voltage potential to the semiconductor chips 19a and 19b, a ground line 23 for supplying a ground voltage potential to the semiconductor chips 19a and 19b, output lines 21a and 21b to which an output signal is supplied from the semiconductor chips 19a and 19b, and an insulator layer 11 for covering the output lines 21a and 21b. The insulator layer 11 is formed so that no insulator layer is arranged in the area between the power source line 22 and the ground line 23.

10 Claims, 21 Drawing Sheets

VII-VII CROSS-SECTIONAL VIEW

SEMICONDUCTOR CHIP MOUNTING SUBSTRATE, ELECTROOPTICAL DEVICE, LIQUID-CRYSTAL DEVICE, ELECTROLUMINESCENT DEVICE, AND ELECTRONIC EQUIPMENT

BACKGROUND OF THE INVENTION

1. Technical Field of the Invention

The present invention relates to a semiconductor chip mounting substrate bearing a semiconductor chip thereon. The present invention also relates to an electrooptical device that presents images using an electrooptical material such as a liquid crystal or an electroluminescent material, a liquid-crystal device that presents images by controlling the orientation of the liquid crystal to modulate light, an electroluminescent device that presents images using an organic electroluminescent element, and electronic equipment incorporating the electrooptical device.

2. Description of the Related Art

Electrooptical devices such a liquid-crystal device or an electroluminescent device (hereinafter referred to as an EL device) are widely used as a display unit in electronic equipment such as a mobile computer, a mobile telephone, and a video camera.

The liquid-crystal device with a liquid crystal as an electrooptical material sandwiched between a pair of electrodes controls the orientation of the liquid crystal by controlling a voltage applied to the electrodes, modulating a light beam transmitted through the liquid crystal, and thereby displaying an image such as characters and numerals.

The EL device with an EL light emission layer as an electrooptical material sandwiched between a pair of electrodes controls a voltage applied to these electrodes, thereby controlling a current fed to the EL light emission layer. The light emitted by the light emission layer is thus controlled, displaying an image such as characters and numerals.

In the liquid-crystal device or the EL device, electrodes for sandwiching the liquid crystal or the EL light emission layer are formed on one or a plurality of substrates. For example, the liquid-crystal device includes a pair of substrates facing each other having respective electrodes. On the other hand, the EL device includes, on the surface of one substrate, a pair of electrodes having an EL emission layer sandwiched therebetween. These electrooptical devices have a plurality of electrodes within an effective display area of the substrate, and extension lines extending from the plurality of electrodes, and metal lines, different from the extension lines, are arranged outside the effective display area. The electrodes formed within the effective display area are manufactured of oxides such as ITO, or a metal such as an APC alloy or Cr. When the electrodes are manufactured of a metal, the extension lines extending therefrom are also a metal wire.

For example, the metal lines, different from the extension lines, extending beyond the effective display area, may be used in a circuit board, such as a COG (Chip On Glass) board, on which a semiconductor chip is directly mounted. The metal lines in this case are connected to input terminals of the semiconductor chip, such as input bumps of the semiconductor chip, and connected to an FPC (Flexible Printed Circuit) leading to an external circuit.

It is known that the liquid-crystal device and the EL device employ an electrically conductive oxide such as ITO (Indium Tin Oxide) as a material for electrodes on the substrate, and a metal such as APC or Cr as a material for a metal line formed on the substrate. The APC is an alloy manufactured of Ag (silver), Pd (palladium), and Cu (copper).

The ITO has been widely used as a material for electrodes, etc. The ITO has a high electrical resistivity. If an ITO line is routed for a long path on a substrate, a resulting resistance becomes high, and a driving circuit cannot work normally. Contemplated as a promising material are low electrical resistivity metal such as APC or Cr. For example, resistance of ITO per unit area is 15 ohms, while resistance of Cr per unit area is 1.5 ohms and resistance of APC per unit area is 0.1 ohm. If a wiring pattern is manufactured of such a low resistivity metallic material on a substrate, a wiring pattern having a long length has advantageously a low resistance.

Fabricating a wiring pattern on a substrate of a metal such as APC or Cr advantageously lowers electrical resistance thereof. On the other hand, the use of metals present a new problem. The metal line is subject to corrosion. Due to migration, namely, the transfer of atoms damages the metal line, and the quality of wiring cannot be maintained.

The inventors of the present invention have conducted a variety of experiments in an attempt to resolve the problem of metallic corrosion or migration, and have reached the following conclusion. When a plurality of metal wirings is arranged side by side on a substrate, a potential difference may take place between adjacent wirings. In other words, a relationship of an anode and a cathode is established between the adjacent wirings, and a metallic component of the anode, for example, Ag is considered to dissolve.

In view of the above problem relating to the conventional wiring substrate, the present invention has been developed. It is an object of the present invention to prevent corrosion or migration from taking place in a metal wiring even when a wiring pattern is formed of a low electrical resistivity metallic material.

SUMMARY OF THE INVENTION (1) To achieve the above object, a semiconductor chip mounting substrate of the present invention having a semiconductor chip mounted thereon, includes a power source line for supplying a supply voltage potential to the semiconductor chip, a ground line for supplying a ground voltage potential to the semiconductor chip, an output line to which an output signal from the semiconductor chip is supplied, and an insulator layer for covering the output line, wherein the insulator layer is formed clear of an area between the power source line and the ground line.

The lines formed on the substrate are typically divided into lines routed between an electrode and a driving element and lines routed between an external circuit board and the driving element. Migration mainly takes place in the line routed between the external circuit board and the driving element. The lines routed between the external circuit board and the driving element include power source supply voltage lines such as a power source line and a ground line, a data line for transferring a data signal, and a control signal for controlling drivers, etc.

The inventors have studied the problems, and have found that corrosion and migration take place at almost the same locations, particularly in the power source supply voltage lines. In contrast, the signal lines are almost free from migration. In other words, migration occurs in the power source supply voltage lines which present a large potential difference between adjacent lines.

According the observation of the inventors, the generation of migration is largely dependent on an insulator layer covering the lines. Specifically, the line is produced by forming a metal layer and then by patterning the metal layer. To pattern the metal layer, a photoresist is deposited on the metal layer, and etching is further performed. In this process, the surface of the line is inevitably contaminated. Although the substrate is cleaned after the formation of the line, contamination may occasionally not be fully removed.

If an insulator layer is deposited on the line with the surface thereof contaminated, the insulator layer contains the contamination with no escape path left. When the line is now supplied with a voltage potential, migration tends to occur more easily between adjacent lines in the power supply voltage system than in other areas because the potential difference between the adjacent lines, namely, the magnitude of electric field is large there. When the line is contaminated, contamination is encapsulated by the insulator layer. The application of voltage fully establishes a condition under which migration easily occurs.

In accordance with the present invention, the insulator layer is formed clear of the area between the power source line and the ground line. In other words, no insulator layer is arranged between the power source line and the ground line. In this arrangement, contamination is not encapsulated by the insulator layer even if the lines in the supply voltage system are contaminated. Migration is thus prevented from being generated when a high-voltage is applied during driving.

Any of a variety of metals may be used for a metal forming the power source supply voltage system. The APC alloy is one of these metals. The APC may also be used for a material of a reflective layer. The reflective layer of the APC alloy provides a high reflectance in comparison with that of aluminum, while resulting in a low resistance wiring at the same time.

(2) A semiconductor chip mounting substrate of the present invention having a semiconductor chip mounted thereon, includes an output line to which an output signal is supplied from the semiconductor chip mounted on the semiconductor chip mounting substrate, a first region formed in a first side of the substrate, a second region formed in another side intersecting the first side of the substrate, a power source line, extending across the first region and the second region, for supplying a supply voltage potential to the semiconductor chip, a ground line, extending across the first region and the second region, for supplying a ground voltage potential to the semiconductor chip, an external circuit board connected, in the second region, to the ground line and the power source line, and an insulator layer for covering the output line, wherein the semiconductor chip is mounted in the first region, and the insulator layer is formed clear of (e.g., outside of) an area between the power source line and the ground line.

Since the power source line and the ground line extend across the first region and the second region in the semiconductor chip mounting substrate, the lines are lengthened. Migration occurs easily when the lines are lengthened, compared to when the length of the lines is short. If the present invention is implemented in the semiconductor chip mounting substrate having the above-referenced structure, the generation of migration is reliably controlled.

(3) The semiconductor chip mounting substrate of the present invention may further include a second semiconductor chip mounted in the second region, in addition to the first semiconductor chip mounted in the first region. With the number of semiconductor chips mounted on the substrate increasing, the possibility that lines having a large potential difference are adjacent to each other becomes high, and the generation of migration is more likely. If the present invention is implemented in that semiconductor chip mounting substrate, migration is reliably controlled.

(4) An electrooptical device of the present invention having an electrooptical layer, includes a substrate for supporting the electrooptical layer, an electrode for driving the electrooptical layer, a driving element mounted on the substrate, an output line, connected to the driving element, for supplying an output signal output from the driving element to the electrode, an insulator layer for covering the output line, a power source line, formed on the substrate, for supplying a supply voltage potential to the driving element, and a ground line, formed on the substrate, for supplying a ground voltage potential to the driving element, wherein the insulator layer is formed clear of an area between the power source line and the ground line.

The insulator layer is formed clear of the area between the power source line and the ground line in the electrooptical device. In this arrangement, contamination is not encapsulated by the insulator layer even if the lines in the supply voltage system are contaminated. Migration is thus prevented from being generated even when a high-voltage is applied during driving.

(5) In the electrooptical device of the present invention, the power source line may include a layer containing a metal as a major composition thereof. Since the electrical resistance of the line is set to be low, the electrical circuit is kept to a stabilized state, and the line may be extended even longer.

(6) In the electrooptical device of the present invention, the layer containing the metal as the major composition thereof may contain a metal selected from the group consisting of silver, palladium, and copper. An alloy containing all of silver, palladium, and copper is a so-called APC alloy. The APC alloy has an excellent light reflectance, and if the APC alloy is used for an reflective element in the electrooptical device, the display presents an image brighter than that presented by a device that employs Al (aluminum) for a light reflective element.

(7) In the electrooptical device of the present invention, at least one of the power source line and the ground line may include a laminate structure formed of a metal and a metal oxide. If the power source line and the ground line are fabricated of a metal alone, they are subject to corrosion and peeling. If the metal is covered with a metal oxide, corrosion and peeling are controlled. Further, if the power source line and the ground line are fabricated of a metal alone, an impurity dissolves from the metal, possibly contaminating the electrooptical material such as the liquid crystal or the electroluminescent material. With the metal covered with the metal oxide, however, such contamination is controlled.

(8) In the electrooptical device of the present invention, the electrooptical layer may be selected from an organic electroluminescent layer and a liquid-crystal layer. When the liquid-crystal layer is selected, the light transmitted through the liquid crystal is controlled by controlling the orientation of the liquid crystal, wherein polarized light transmitted through a polarizer and polarized light blocked by the polarizer are used to present a display. When the electroluminescent layer is selected, a display is presented by allowing organic electroluminescent elements to emit light on a per pixel basis.

(9) In the electrooptical device of the present invention, the electrooptical layer may be sandwiched between the electrode and a second electrode, and one of the electrode and the second electrode may be connected to a switching element. With this arrangement, a plurality of pixels forming the display area is turned on and off under the control of the switching element in the switching function thereof.

(10) In the electrooptical device of the present invention, the switching element may be selected from a thin-film transistor and a thin-film diode. The thin-film transistor is a three-terminal switching element. The thin-film diode is a two-terminal switching element.

(11) An electrooptical device of the present invention may further include a second electrode for driving the electrooptical layer. The electrooptical layer is sandwiched between the electrode and the second electrode, and includes a second driving element mounted on the substrate, an insulator layer for covering the output line, a second power source line, formed on the substrate, for supplying a supply voltage potential to the second driving element, and a second ground line, formed on the substrate, for supplying a ground voltage potential to the second driving element, and wherein the insulator layer is formed clear of an area between the second power source line and the second ground line.

The electrooptical device thus constructed includes two driving elements mounted on one substrate, and the insulator layer is formed clear of the area between the second power source line and the second ground line.

(12) An electrooptical device of the present invention having an electrooptical layer, includes a substrate for supporting the electrooptical layer, an electrode for driving the electrooptical layer, a driving element mounted on the substrate, an output line, connected to the driving element, for supplying an output signal output from the driving element to the electrode, an insulator layer for covering the output line, a power source line, formed on the substrate, for supplying a supply voltage potential to the driving element, a ground line, formed on the substrate, for supplying a ground voltage potential to the driving element, a control line, formed on the substrate, for supplying a control signal to control the driving element, and a data line, formed on the substrate, for supplying a data signal to the driving element. The insulator layer is formed clear of one of an area (1) between the power source line and the control line, an area (2) between the power source line and the data line, an area (3) between the ground line and the control line, and an area (4) between the ground line and the data line.

In the electrooptical device in this arrangement, the insulator layer is patterned in relation to the power source line and the ground line. Furthermore, the control line and the data line are also taken into consideration in the determination of the pattern of the insulator layer. With this arrangement, migration is controlled when a large potential difference takes place between a plurality of lines including the control line and the data line in the same way as when a large potential difference takes place between the power source line and the ground line.

(13) A liquid-crystal device of the present invention includes a first substrate having a first electrode, a second substrate having a second electrode and arranged to face the first substrate, a liquid-crystal layer interposed between the first electrode and the second electrode, a liquid-crystal driving IC mounted on a portion of the first substrate extending beyond the area thereof coextending with the second substrate, an output line, connected to the liquid-crystal driving IC, for supplying an output signal output from the liquid-crystal driving IC to one of the first electrode and the second electrode, an insulator layer for covering the output line, a power source line, formed on one of the first substrate and the second substrate, for supplying a supply voltage potential to the liquid-crystal driving IC, and a ground line, formed on one of the first substrate and the second substrate, for supplying a ground voltage potential to the liquid-crystal driving IC, wherein the insulator layer is formed clear of an area between the power source line and the ground line.

In the liquid-crystal device thus constructed, the insulator layer is formed clear of the area between the power source line and the ground line. In other words, no insulator layer is arranged between the power source line and the ground line. In this arrangement, contamination is not encapsulated by the insulator layer even if the lines in the supply voltage system are contaminated in the manufacturing process of the liquid-crystal device. Migration is thus prevented from being generated even when a high-voltage is applied during driving.

(14) In the liquid-crystal device of the present invention, the power source line may include a laminate structure containing a plurality of layers, and one of the first electrode and the second electrode, formed on the same substrate as that bearing the power source line, may also include a laminate structure of a plurality of layers. In other words, the electrode and the power source line formed on the same substrate are fabricated of the same layer structure. In this arrangement, the power source line and the electrode are concurrently fabricated in the same process. The manufacturing process is thus simplified.

(15) The liquid-crystal device of the present invention may further include a reflective layer, wherein the laminate structure contains a metal layer and a metal oxide layer formed on the metal layer, and wherein the metal layer is formed of the same layer as that forming the reflective layer. In this arrangement, the manufacturing process of the liquid-crystal device is simplified.

(16) A liquid-crystal device of the present invention includes a first substrate having a first electrode, a second substrate having a second electrode and arranged to face the first substrate, a liquid-crystal layer interposed between the first electrode and the second electrode, a first liquid-crystal driving IC mounted on a first side of the first substrate extending beyond the area thereof coextending with the second substrate, a second liquid-crystal driving IC mounted on an extending portion of a second side of the first substrate, intersecting the first side of the first substrate, a plurality of lines connected to one of the first liquid-crystal driving IC and the second liquid-crystal driving IC, and an insulator layer for covering several of the plurality of lines, wherein the plurality of lines includes a power source line for supplying a supply voltage potential to the first liquid-crystal driving IC and a ground line for supplying a ground voltage potential to the first liquid-crystal driving IC, and wherein the insulator layer is formed clear of an area between the power source line and the ground line.

The liquid-crystal device thus constructed includes two driving elements mounted on one substrate, and the insulator layer is formed clear of the area between the second power source line and the second ground line for the two liquid-crystal driving ICs.

(17) A liquid-crystal device includes a first substrate having a first electrode, a second substrate having a second electrode and arranged to face the first substrate, a liquid-crystal layer interposed between the first electrode and the second electrode, a liquid-crystal driving IC mounted on a portion of the first substrate extending beyond the area thereof coextending with the second substrate, an output line, connected to the liquid-crystal driving IC, for supplying an output signal output from the liquid-crystal driving IC to one of the first electrode and the second electrode, an insulator layer for covering the output line, a power source line, formed on one of the first substrate and the second substrate, for supplying a supply voltage potential to the liquid-crystal driving IC, a ground line, formed on one of the first substrate and the second substrate, for supplying a ground voltage potential to the liquid-crystal driving IC, a control line, formed on one of the first substrate and the second substrate, for supplying a control signal to control the liquid-crystal driving IC, and a data line, formed on one of the first substrate and the second substrate, for supplying a data signal to the liquid-crystal driving IC. The insulator layer is formed clear of one of an area (1) between the power source line and the control line, an area (2) between the power source line and the data line, an area (3) between the ground line and the control line, and an area (4) between the ground line and the data line.

In the liquid-crystal device in this arrangement, the insulator layer is patterned in relation to the power source line and the ground line. Furthermore, the control line and the data line are also taken into consideration in the determination of the pattern of the insulator layer. With this arrangement, migration is controlled when a large potential difference takes place between a plurality of lines including the control line and the data line in the same way as when a large potential difference takes place between the power source line and the ground line.

(18) An electroluminescent device of the present invention includes a base structure, a first electrode mounted on the base structure, an electroluminescent layer arranged on the first electrode, a second electrode arranged on the electroluminescent layer, a first driving IC mounted on a first side of the base structure, and connected to the first electrode, a second driving IC mounted on a second side of the base structure, intersecting the first side thereof, and connected to the second electrode, a power source line for supplying a supply voltage potential to one of the first driving IC and the second driving IC, a ground line for supplying a ground voltage potential to one of the first driving IC and the second driving IC, an output line to which an output signal output from one of the first driving IC and the second driving IC is supplied, and an insulator layer for covering the output line, wherein the insulator layer is formed clear of an area between the power source line and the ground line.

In the electroluminescent device thus constructed, the insulator layer is formed clear of the area between the power source line and the ground line. In other words, no insulator layer is arranged between the power source line and the ground line. In this arrangement, contamination is not encapsulated by the insulator layer even if the lines in the supply voltage system are contaminated in the manufacturing process of the electroluminescent device. Migration is thus prevented from being generated when a high-intensity electric field is applied during driving of the electroluminescent device.

(19) An electroluminescent device of the present invention includes a base structure, an anode electrode mounted on the base structure, an electroluminescent layer arranged on the anode electrode, a cathode electrode arranged on the electroluminescent layer, a first driving element connected to at least one of the anode electrode and the cathode electrode, a plurality of first input lines connected to the first driving element, and an insulator layer for covering several of the input lines, wherein the first input lines include a power source line for supplying a supply voltage potential to the first driving element and a ground line for supplying a ground voltage potential to the first driving element, and wherein the insulator layer is formed clear of an area between the power source line and the ground line.

In the electroluminescent device thus constructed, the insulator layer is formed clear of the area between the power source line and the ground line. In other words, no insulator layer is arranged between the power source line and the ground line. In this arrangement, contamination is not encapsulated by the insulator layer even if the lines in the supply voltage system are contaminated in the manufacturing process of the electroluminescent device. Migration is thus prevented from being generated even when a high-intensity electric field is applied during driving of the electroluminescent device.

(20) An electroluminescent device of the present invention includes a second driving element connected to the other of the anode electrode and the cathode electrode, an output line, connected to the second driving element, for supplying an output signal output from the second driving element to the other electrode, and a plurality of second input lines, formed on the base structure, for supplying an input signal to the second driving element, wherein the second input lines include a power source line for supplying a supply voltage potential to the second driving element and a ground line for supplying a ground voltage potential to the second driving element, and wherein the insulator layer is formed clear of an area between the power source line and the ground line.

In the electroluminescent device thus constructed, the insulator layer is formed clear of the area between the power source line and the ground line. In other words, no insulator layer is arranged between the power source line and the ground line. In this arrangement, contamination is not encapsulated by the insulator layer even if the lines in the supply voltage system are contaminated in the manufacturing process of the electroluminescent device. Migration is thus prevented from being generated even when a high-intensity electric field is applied during driving of the electroluminescent device.

(21) An electroluminescent device of the present invention includes a base structure, an anode electrode mounted on the base structure, an electroluminescent layer arranged on the anode electrode, a cathode electrode arranged on the electroluminescent layer, a driving element connected to at least one of the anode electrode and the cathode electrode, an output line, connected to the driving element, for supplying an output signal output from the driving element to one of the anode electrode and the cathode electrode, an insulator layer for covering the output line, a power source line, formed on the base structure, for supplying a supply voltage potential to the driving element, a ground line, formed on the base structure, for supplying a ground voltage potential to the driving element, a control line, formed on the base structure, for supplying a control signal to control the driving element, and a data line, formed on the base structure, for supplying a data signal to the driving element, wherein the insulator layer is formed clear of one of an area (1) between the power source line and the control line, an area (2) between the power source line and the data line, an area (3) between the ground line and the control line, and an area (4) between the ground line and the data line.

In the electroluminescent device in this arrangement, the insulator layer is patterned in relation to the power source line and the ground line. Furthermore, the control line and the data line are also taken into consideration in the determination of the pattern of the insulator layer. With this arrangement, migration is controlled when a large potential difference takes place between a plurality of lines including the control line and the data line in the same way as when a large potential difference takes place between the power source line and the ground line.

(22) Electronic equipment of the present invention includes as a display unit thereof an electrooptical device according to one of the above-referenced electrooptical devices. The electronic equipment, with the electrooptical device thereof free from migration during use, maintains the image quality thereof for a long period of time. The electronic equipment may be mobile equipment such as a mobile telephone or a mobile information terminal, or may be a video camera.

DETAILED DESCRIPTION OF THE PREFERRED EMBODIMENTS

Figure 1:
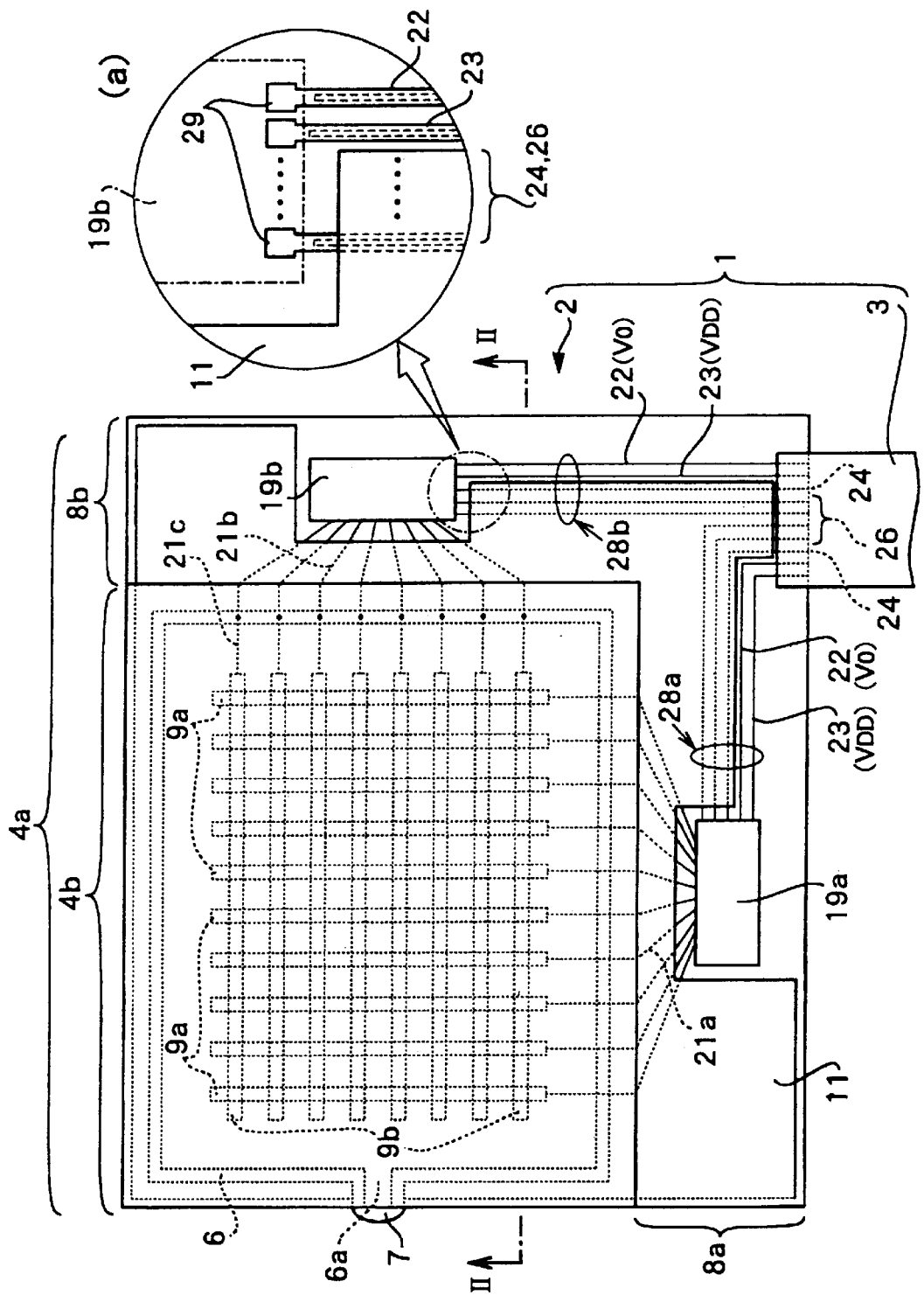
FIG. 1 is a plan view showing one embodiment of the liquid-crystal device of the present invention.

FIG. 1 shows one embodiment of a liquid-crystal device as one example of the electrooptical device employing a semiconductor chip mounting substrate of the present invention. The liquid-crystal device 1 is manufactured by connecting an external wiring board, such as an FPC (Flexible Printed Circuit) 3 to a liquid-crystal panel 2 for presenting a color display of a reflective type, and by arranging other additional devices to the liquid-crystal panel 2.

The FPC 3 is a circuit board which bears an electronic circuit formed of a metal layer pattern of copper or other metal arranged on a flexible board manufactured of polyimide, etc. The FPC 3 electrically interconnects a control circuit of electronic equipment incorporating the liquid-crystal panel 2 to the liquid-crystal panel 2. Contemplated as the additional devices are an illumination device such as a backlight or a front light. Since this embodiment of the present invention is of a reflective type liquid-crystal device, no illumination unit is required.

Figure 2:
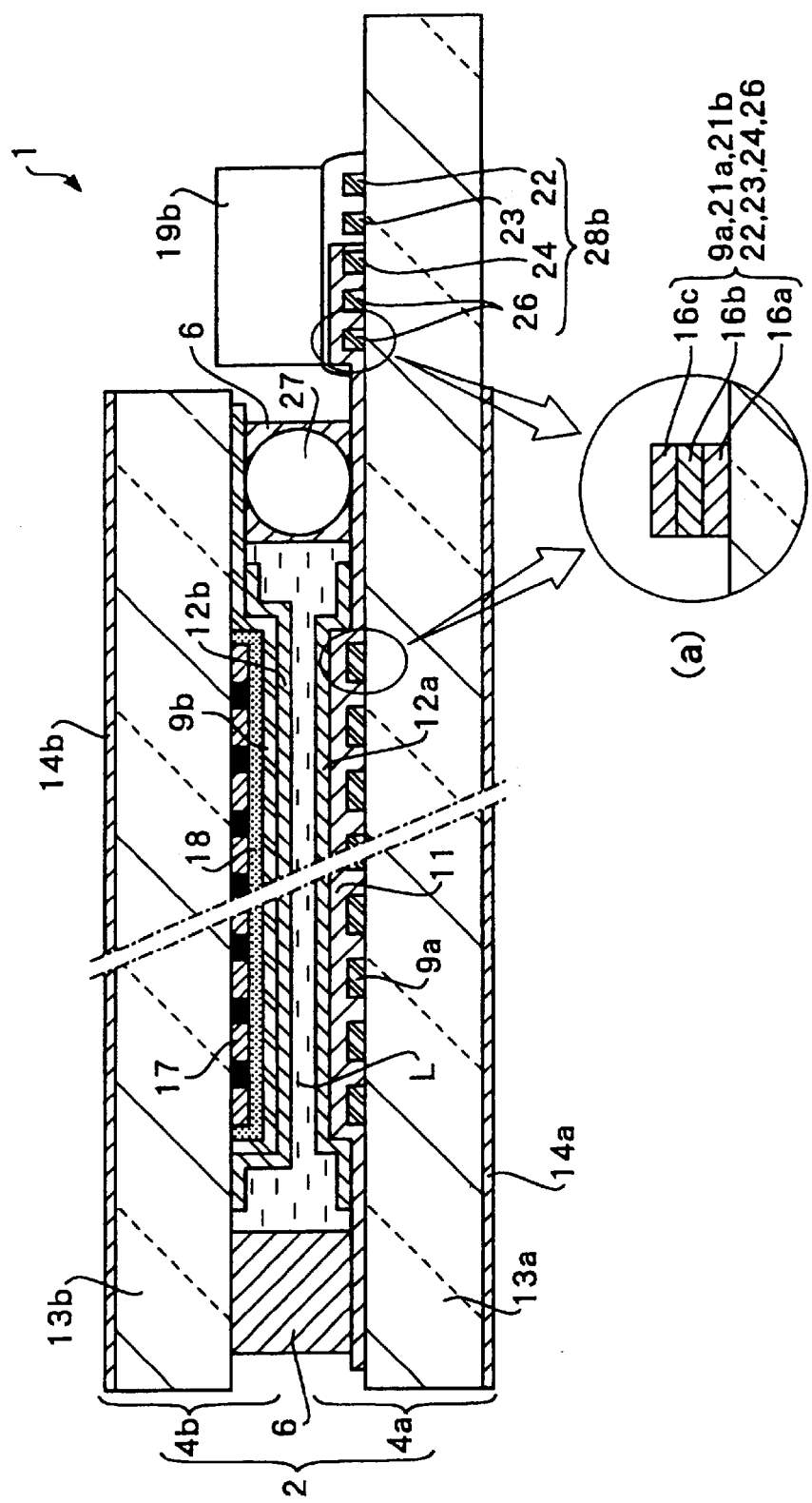
FIG. 2 is a cross-sectional view of the liquid-crystal device taken along line II—II in FIG. 2.

Referring to FIG. 1, the liquid-crystal panel 2 is manufactured by bonding a first substrate 4a on the back side to a second substrate 4b on the front side with a annular sealing member 6 interposed therebetween. The sealing member 6 has an opening 6a through which a liquid crystal is introduced. A cell gap is formed between the first substrate 4a and the second substrate 4b bonded with the sealing member 6 interposed therebetween as shown in FIG. 2. The liquid crystal L is introduced into the cell gap through the opening 6a (see FIG. 1). After the liquid crystal L is introduced, the opening 6a is closed by a resin 7.

Referring to FIG. 2, the first substrate 4a includes a base structure 13a fabricated of glass, plastic, or the like. First electrodes 9a are formed on the surface of the base structure 13a facing the liquid crystal (the top side of the base structure 13a as shown in FIG. 2), and an insulator layer 11 is deposited on the first electrodes 9a, and an alignment layer 12a is formed on the insulator layer 11. A polarizer 14a is glued onto the outer surface of the base structure 13a (the bottom side of the base structure 13a as shown in FIG. 2). The insulator layer 11 is fabricated of a silicon oxide. The alignment layer 12a is fabricated of polyimide, for example.

Optical elements other than those described above are arranged on both sides of the base structure 13a, as necessary. For example, a retardation layer may be arranged between the base structure 13a and the polarizer 14a, and an underlying layer may be arranged between the base structure 13a and the first electrodes 9a.

The first electrodes 9a are formed using a photolithographic technique. As shown in FIG. 1, a plurality of linear electrodes are arranged side by side with spacings assured therebetween, thereby forming a generally striped configuration. Referring to FIG. 1, the first electrodes 9a are diagrammatically exaggerated with each electrode wider than the actual width thereof and the spacing between the electrodes wider than the actual spacing thereof.

In this embodiment, the first electrode 9a is a three-layer structure that is produced by successively laminating a first layer 16a fabricated of the ITO, which is a metal oxide, a second layer 16b fabricated of the APC, which is a metal alloy, and a third layer 16c fabricated of the ITO, which is a metal oxide as shown in FIG. 2(a). The second layer 16b of the APC has a double function as an electrode and as a light reflective layer.

In the first electrode 9a, the ITO layer as the first layer 16a enhances bond of the APC layer as the second layer 16b to the base structure 13a. The ITO layer as the third layer 16c prevents the second layer 16b of the APC from corroding and peeling, while preventing an impurity from dissolving from the second layer 16b at the same time.

Referring to FIG. 2, the second substrate 4b includes a base structure 13b fabricated of glass, plastic, or the like. A color filter 17 is formed on the surface of the base structure 13b facing the liquid crystal (the bottom side of the base structure 13b as shown in FIG. 2), a planarizing layer 18 is formed beneath the color filter 17, a second electrode 9b is formed beneath the planarizing layer 18, and an alignment layer 12b is arranged beneath the second electrode 9b. A polarizer 14b is glued onto the outer surface of the base structure 13b (on the top side of the base structure 13b as shown in FIG. 2).

The color filter 17 is composed of two-dimensionally arranged three color elements of red, green, and blue, or cyan, magenta, and yellow in a striped configuration or any known configuration. Spacings between the color elements are filled with a black mask. The planarizing layer 18 is fabricated of acrylic resin. The alignment layer 12b is fabricated of polyimide, for example.

Optical elements other than those described above are arranged on both sides of the second base structure 13b, as necessary. For example, a retardation layer may be arranged between the second base structure 13b and the polarizer 14b.

The second electrodes 9a are formed of the ITO, which is a transparent metal oxide, using a photolithographic technique. As shown in FIG. 1, a plurality of linear electrodes are arranged side by side with spacings assured therebetween, thereby forming a generally striped configuration. Referring to FIG. 1, the second electrodes 9b are diagrammatically exaggerated with each electrode wider than the actual width thereof and the spacing between the electrodes wider than the actual spacing thereof.

The first electrodes 9a and the second electrodes 9b bonded the first substrate 4a and the second substrate 4b together with the sealing member 6 interposed therebetween are approximately at a right angle with respect to each other. One of the first electrode 9a and the second electrode 9b works as a scanning electrode, while the other of the first electrode 9a and the second electrode 9b works as a signal electrode.

A dot, which is the minimum unit for presenting an image such as characters and numerals, is formed of an intersection of a stripe of the first electrode 9a and a stripe of the second electrode 9b. Three dots form a single pixel, and a matrix of pixels then forms a display area. In the above-mentioned color filter 17, the pixels of red, green, and blue are arranged corresponding to the respective dots, and the three color dots of red, green, and blue form a single pixel.

Referring to FIG. 1, the first substrate 4a, larger in size than the second substrate 4b, has an extension portion 8b which extends rightward beyond the area thereof coextending with the second substrate 4b, and an extension portion 8a which extends downward beyond the area thereof coextending the second substrate 4b. The extension portions 8a and 8b are a periphery of the display area of the liquid-crystal device 1, not contributing to displaying.

A liquid-crystal driving IC 19a as a driving element is bonded to, namely, mounted to the extension portion 8a using an ACF (Anisotropic Conductive Film). A liquid-crystal driving IC 19b as a driving element is bonded to, namely, mounted to the extension portion 8b using an ACF. One of the liquid-crystal driving IC 19a and the liquid-crystal driving IC 19b is used as a driving IC to feed a data signal, while the other of the liquid-crystal driving IC 19a and the liquid-crystal driving IC 19b is used as a driving IC to feed a scanning signal.

Figure 3:
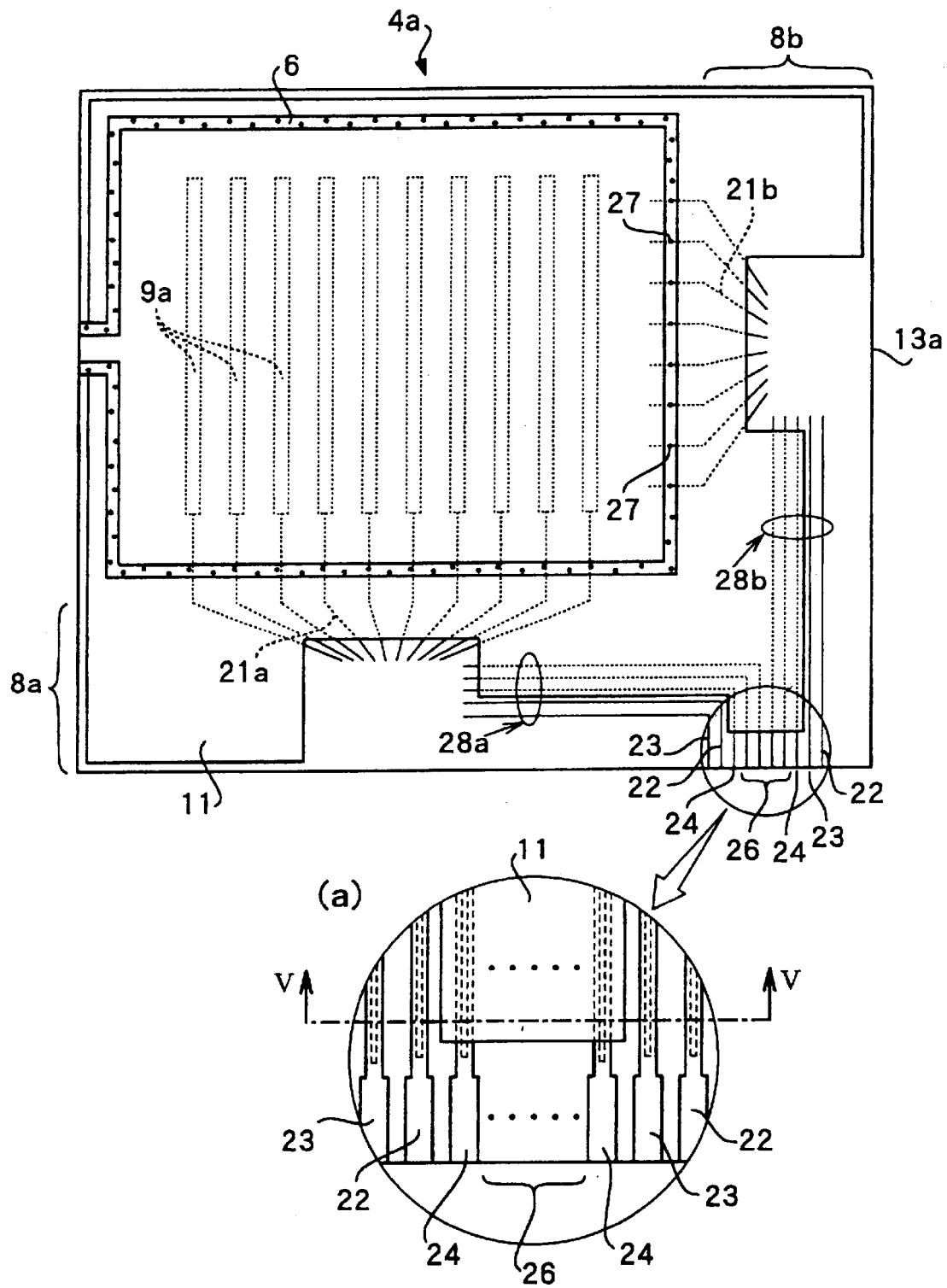
FIG. 3 is a plan view of one substrate forming the liquid-crystal device shown in FIG. 1.

Referring to FIG. 3, arranged on the surface of the first substrate 4a facing the liquid crystal (on the front side of the first substrate 4a shown in FIG. 3) are the insulator layer 11 beneath the sealing member 6, and the first electrodes 9a beneath the insulator layer 11. Output lines 21a and 21b and input lines 28a and 28b are fabricated at the same time when the first electrodes 9a are fabricated. The input lines 28a and 28b respectively include a power source line 22, a ground line 23, a control line 24, and a data line 26.

The output lines 21a respectively extend from the first electrodes 9a, are routed through the sealing member 6, and then reach the extension portion 8a. The output lines 21b are routed through the sealing member 6, with ends thereof reaching the area enclosed by the sealing member 6, namely, the liquid-crystal encapsulated area, and with the other ends extending to the extension portion 8b of the first substrate 4a. The sealing member 6 contains spherical or cylindrical conductors 27 dispersed therewithin.

Figure 4:
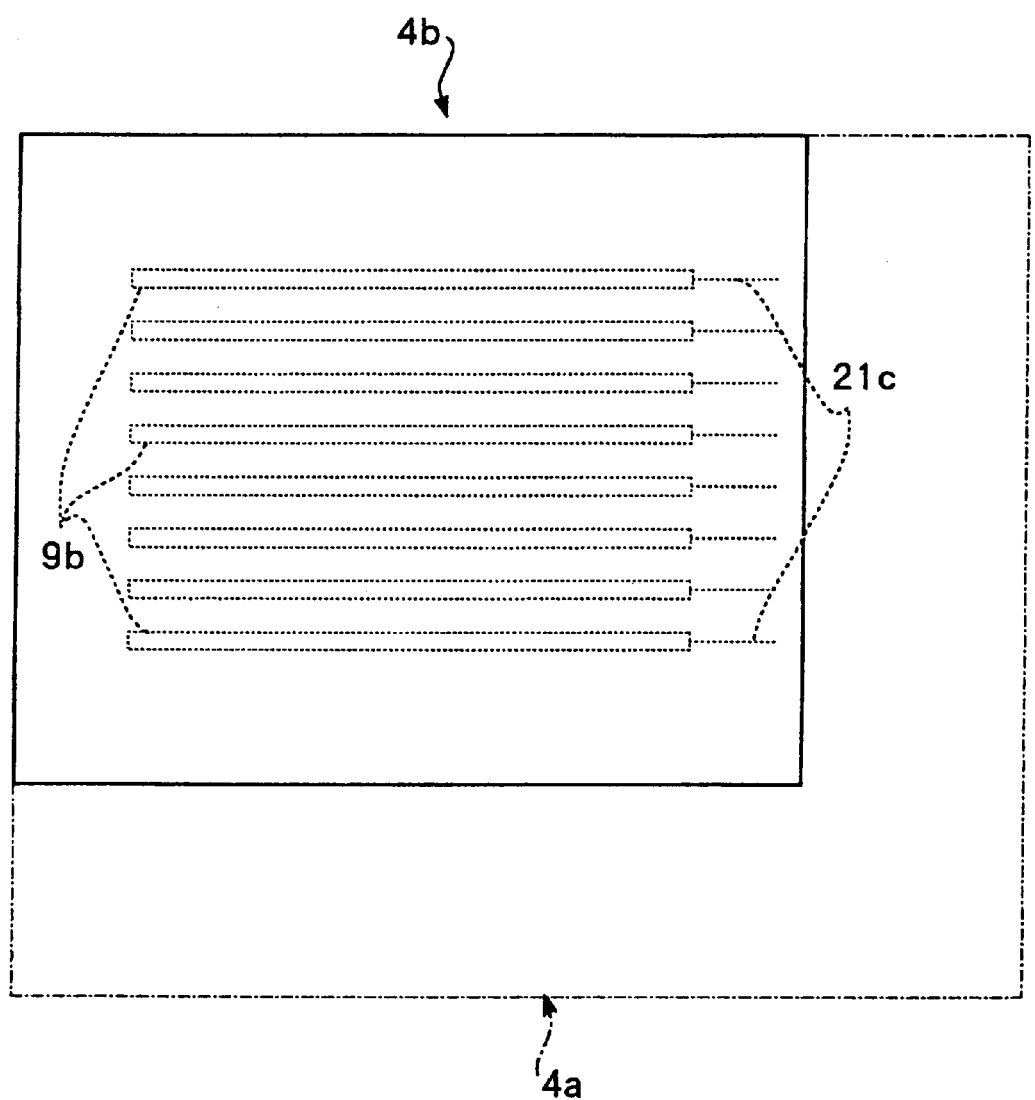
FIG. 4 is a plan view showing the other substrate forming the liquid-crystal device shown in FIG. 1.

Referring to FIG. 4, the second electrodes 9b are formed on the surface of the second substrate 4b facing the liquid crystal (namely, on the back surface of the second substrate 4b as shown in FIG. 4), and the output lines 21c are also formed at the same time. The output lines 21c have a length just enough to pass through the sealing member 6 (see FIG. 3).

When the first substrate 4a shown in FIG. 3 and the second substrate 4b shown in FIG. 4 are bonded together, the output lines 21b on the first substrate 4a are respectively electrically connected to the output lines 21c on the second substrate 4b through conductors 27 dispersed within the sealing member 6. When the liquid-crystal driving IC 19b is mounted on the extension portion 8b, output terminals, namely, output bumps of the liquid-crystal driving IC 19b are respectively connected to the second electrodes 9b through the output lines 21b, the conductors 27, and the output lines 21c. In this way, electrical conduction is thus assured between the first substrate 4a and the second substrate 4b. When the liquid-crystal driving IC 19a is mounted on the extension portion 8a, output terminals, namely, output bumps of the liquid-crystal driving IC 19a are respectively connected to the first electrodes 9a through the output line 21a.

Referring to FIG. 1, the power source lines 22 included in the input lines 28a and 28b feed a supply voltage potential VDD from the FPC 3 connected to the first substrate 4a to each of the liquid-crystal driving IC 19a and the liquid-crystal driving IC 19b. The ground lines 23 feeds a ground voltage potential V0 from the FPC 3 to each of the liquid-crystal driving IC 19a and the liquid-crystal driving IC 19b. The control lines 24 feed a control signal from the FPC 3 to each of the liquid-crystal driving IC 19a and the liquid-crystal driving IC 19b. The data lines 26 feed a data signal from the FPC 3 to each of the liquid-crystal driving IC 19a and the liquid-crystal driving IC 19b. Referring to FIG. 1(a), each line is ended with a respective terminal pad 29, which is put into contact with a bump of the liquid-crystal driving IC 19b.

The control signal controls the operation of each of the liquid-crystal driving IC 19a and the liquid-crystal driving IC 19b. The data signal represents characters, numerals, etc. to be displayed. The control signal and the data signal are substantially low in level compared with a potential difference between the supply voltage potential VDD and the ground voltage potential V0.

Figure 5:
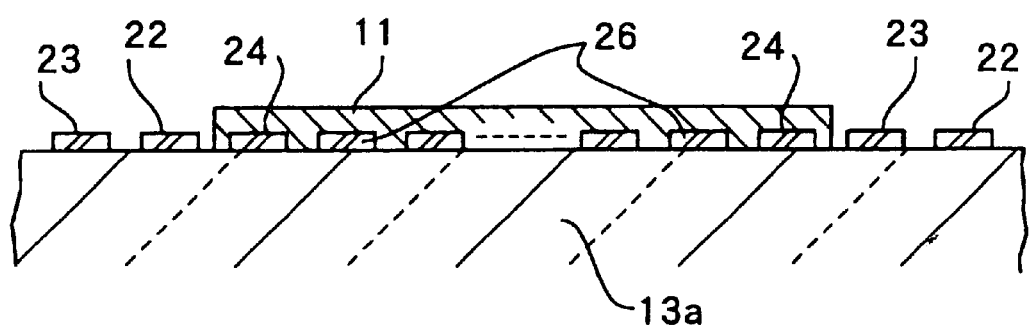
FIG. 5 is a cross-sectional view taken along line V—V shown in FIG. 3(a).

In this embodiment, the insulator layer 11 shown in FIG. 3 covers the first electrodes 9a, the output lines 21a and 21b, and the input lines 28a and 28b, thereby protecting these lines from damage. Referring to FIG. 3(a), FIG. 1(a), and FIG. 5, in this embodiment, the insulator layer 11 is arranged clear of (i.e., outside of) the area between the power source line 22 and the ground line 23, rather than fully covering the electrodes and the lines.

In the liquid-crystal device 1 of this embodiment constructed as described above referring to FIG. 2, light entering from outside the second substrate 4b, namely, from a viewer's side, is transmitted through the liquid-crystal layer L, reaches the APC layer including the first electrode 9a, namely, a reflective layer, is reflected from the reflective layer, is transmitted again through the liquid-crystal layer L, and then the second substrate 4b, and reaches the polarizer 14b.

Referring to FIG. 1, the dots, at which the first electrodes 9a driven by the liquid-crystal driving IC 19a mutually intersect the second electrodes 9b driven by the liquid-crystal driving IC 19b, are supplied with an application voltage that is controlled on a dot-by-dot basis in response to the combination of the scanning signal and the data signal. In this way, the orientation of the liquid-crystal L present in each dot is controlled on a dot-by-dot basis. Through the control of orientation of the liquid-crystal, light transmitted through the liquid-crystal layer L is modulated dot by dot so that light transmitted through the polarizer 14b and light blocked by the polarizer 14b are determined. As a result, an image such as characters is displayed on the outer surface of the second substrate 4b.

The surfaces of the output lines 21a and 21b and the input lines 28a and 28b may be contaminated in the course of the manufacturing process of the liquid-crystal device. If the insulator layer 11 is deposited on these lines, that contamination may be encapsulated below the insulator layer 11. With a voltage applied under such conditions, migration takes place when a large potential difference takes place between lines, particularly between adjacent lines. The lines are thus damaged, degrading the display quality of the device.

In contrast, in accordance with the present embodiment, the insulator layer 11 is formed clear of an area where a high-intensity electric field is applied, namely, an area between the power source line 22 and the ground line 23. In other words, no insulator layer 11 is arranged in the area between the power source line 22 and the ground line 23. Even if the power source line 22 or the like is contaminated in the manufacturing process in this arrangement, no contamination is encapsulated beneath the insulator layer 11. Even if a high-intensity electric field is applied between the lines during the driving of the liquid-crystal device, the generation of migration is controlled.

Since not only the first electrodes 9a but also the output lines 21a and 21b and the input lines 28a and 28b are fabricated of the reflective layer 16b in this embodiment, a reflective layer having a high reflectance results. For this reason, the device increases luminance on the display screen thereof, thereby presenting a bright image. With the lines fabricated of the APC layer, electrical resistance thereof is reduced. The speed of the operation is thus increased.

Although the color filter 17 is arranged in the second substrate 4b in this embodiment, the color filter 17 may be arranged on the first electrodes 9a of the first substrate 4a. The present invention is applicable to a liquid-crystal device that incorporates no color filter in the construction thereof.

The locations of the liquid-crystal driving ICs 19a and 19b and the patterns of the output lines 21a, 21b, 28a, and 28b may be changed as appropriate.

In the embodiment shown in FIG. 1, the first electrodes 9a and the input lines 28a and 28b have a three-layer structure of ITO/APC/ITO. Alternatively, these may be of a single-layer structure of Cr or Al. The above embodiment has been discussed in connection with a passive-matrix liquid-crystal device. Alternatively, the present invention may be applied to an active-matrix liquid-crystal device.

Figure 6:
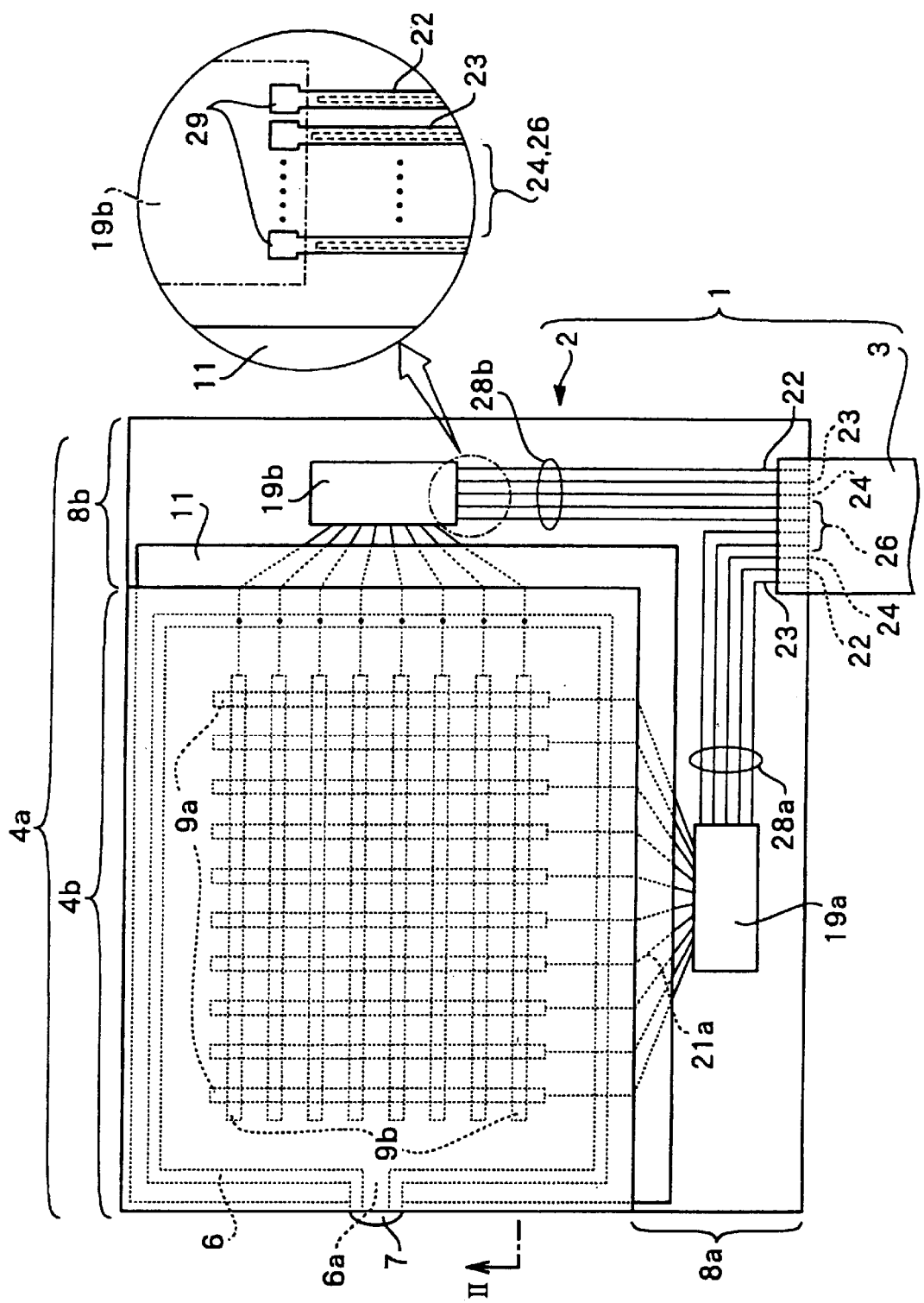
FIG. 6 is a plan view showing a modification of the liquid-crystal device shown in FIG. 1.

FIG. 6 shows an embodiment modified from the first embodiment shown in FIG. 1. In the embodiment shown in FIG. 1, the insulator layer 11 covers the area of the input lines 28a and 28b, while leaving the area between the power source line 22 and the ground line 23 uncovered.

In contrast, in the second embodiment shown in FIG. 6, the entire area of the input lines 28a and 28b is left uncovered with the insulator layer 11. In sum, the insulator layer 11 is arranged clear of not only the area between the power source line 22 and the ground line 23, but also all of the area between the power source line 22 and the control line 24, the area between the power source line 22 and the data line 26, the area between the ground line 23 and the control line 24, and the area between the ground line 23 and the data line 26.

In this liquid-crystal device thus constructed, the generation of migration is reliably controlled not only when a large potential difference takes place between the power source line 22 and the ground line 23, but also when a large potential difference takes place between the plurality of lines, including the control line 24 and the data line 26.

Figure 7:
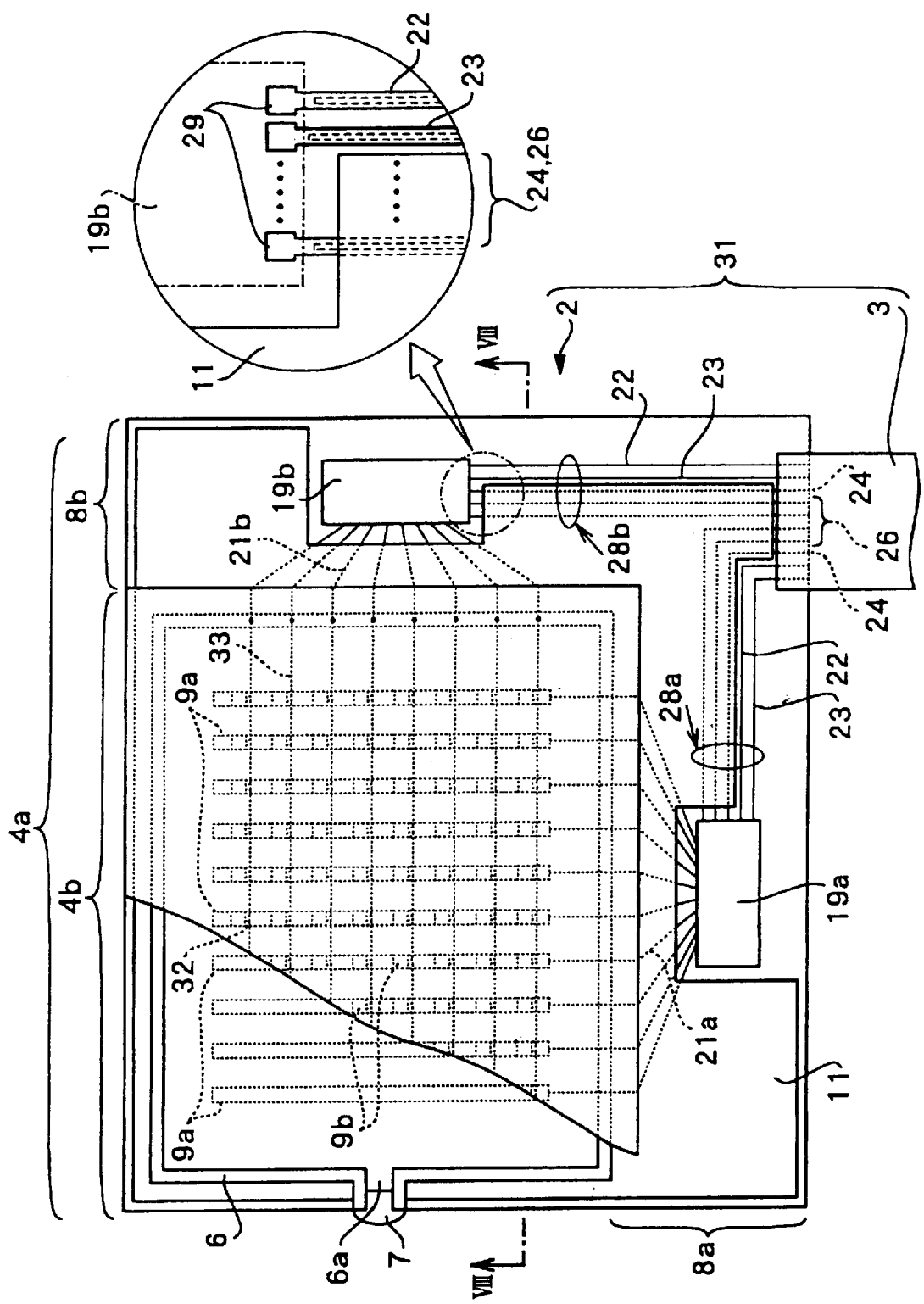
FIG. 7 is a plan view showing another embodiment of the liquid-crystal device of the present invention.

FIG. 7 shows a third embodiment of the liquid-crystal device that incorporates the semiconductor mounting substrate of the present invention. Referring to FIG. 7, components identical to those described with reference to FIG. 1 are designated with the same reference numerals and the discussion thereof is skipped.

A liquid-crystal device 31 is manufactured by connecting an external circuit board such as an FPC (Flexible Printed Circuit) 3 to an active-matrix liquid-crystal panel 2 that presents a color display on a reflective-type screen, and attaching other additional devices to the liquid-crystal panel 2.

Figure 8:
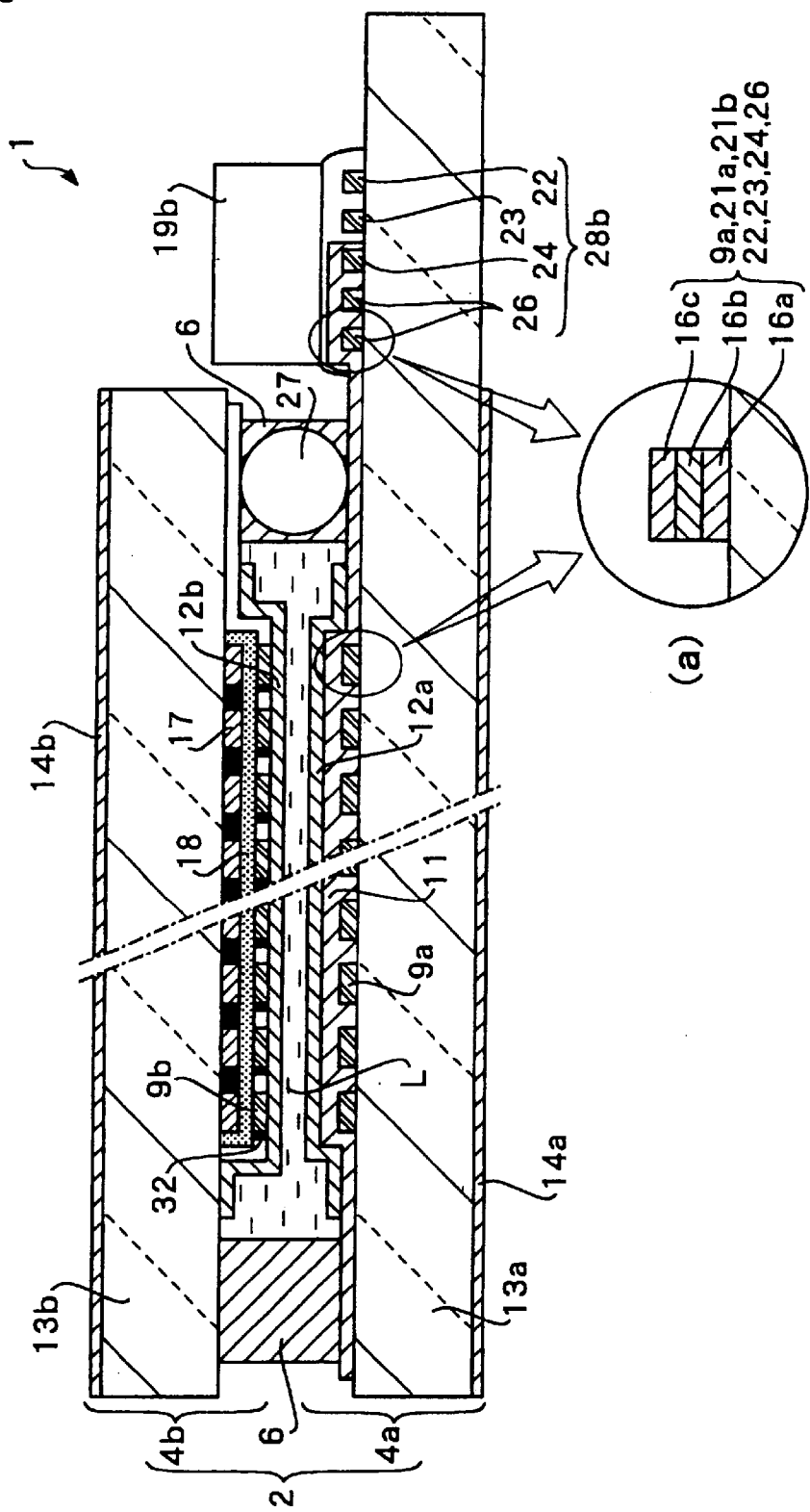
FIG. 8 is a cross-sectional view of the liquid-crystal device, taken along line VIII—VIII in FIG. 7.

Referring to FIG. 7, the liquid-crystal panel 2 is manufactured by bonding a first substrate 4a on the back side to a second substrate 4b on the front side with a annular sealing member 6 interposed therebetween. The sealing member 6 has an opening 6a through which a liquid crystal is introduced. A cell gap is formed between the first substrate 4a and the second substrate 4b bonded with the sealing member 6 interposed therebetween as shown in FIG. 8. The liquid crystal L is introduced into the cell gap through the opening 6a (see FIG. 1). After the liquid crystal L is introduced, the opening 6a is closed by a resin 7.

Referring to FIG. 8, the first substrate 4a includes a base structure 13a fabricated of glass, plastic, or the like. First electrodes 9a are formed on the surface of the base structure 13a facing the liquid crystal (the top side of the base structure 13a as shown in FIG. 8), and an insulator layer 11 is deposited on the first electrodes 9a, and an alignment layer 12a is formed on the insulator layer 11. A polarizer 14a is glued onto the outer surface of the base structure 13a (the bottom side of the base structure 13a as shown in FIG. 8). The insulator layer 11 is fabricated of a silicon oxide. The alignment layer 12a is fabricated of polyimide, for example.

Optical elements other than those described above are arranged on both sides of the base structure 13a, as necessary. For example, a retardation layer may be arranged between the base structure 13a and the polarizer 14a, and an underlying layer may be arranged between the base structure 13a and the first electrodes 9a.

The first electrodes 9a are formed using a photolithographic technique. As shown in FIG. 7, a plurality of linear electrodes are arranged side by side with spacings assured therebetween, thereby forming a generally striped configuration. Referring to FIG. 7, the first electrodes 9a are diagrammatically exaggerated with each electrode wider than the actual width thereof and the spacing between the electrodes wider than the actual spacing thereof.

In this embodiment, the first electrode 9a has a three-layer structure that is produced by successively laminating a first layer 16a fabricated of the ITO, which is a metal oxide, a second layer 16b fabricated of the APC, which is a metal alloy, and a third layer 16c fabricated of the ITO, which is a metal oxide as shown in FIG. 8(a). The second layer 16b of the APC has a double function as an electrode and as a light reflective layer.

Referring to FIG. 8, the second substrate 4b includes a base structure 13b fabricated of glass, plastic, or the like. A color filter 17 is formed on the surface of the base structure 13b facing the liquid crystal (the bottom side of the base structure 13b as shown in FIG. 8), a planarizing layer 18 is formed beneath the color filter 17, a pixel electrode 9b as a second electrode is formed beneath the planarizing layer 18, and an alignment layer 12b is arranged beneath the pixel electrode 9b. A polarizer 14b is glued onto the outer surface of the base structure 13b (on the top side of the base structure 13b as shown in FIG. 8).

The color filter 17 is composed of two-dimensionally arranged three color elements of red, green, and blue, or cyan, magenta, and yellow in a striped configuration or any known configuration. Spacings between the color elements are filled with a black mask. The planarizing layer 18 is fabricated of acrylic resin. The alignment layer 12b is fabricated of polyimide, for example.

Optical elements other than those described above are arranged on both sides of the second base structure 13b, as necessary. For example, a retardation layer may be arranged between the second base structure 13b and the polarizer 14b.

The first substrate 4a used in this embodiment may have the same construction as that in the preceding embodiment shown in FIG. 3. In this embodiment as well, the insulator layer 11 covers the first electrodes 9a, the output lines 21a and 21b, and the input lines 28a and 28b, thereby protecting them from damage. Rather than fully covering all the electrodes and lines, the insulator layer 11 is formed clear of the area between the power source line 22 and the ground line 23 as shown in FIG. 3(a), FIG. 1(a), and FIG. 5.

Figure 9:
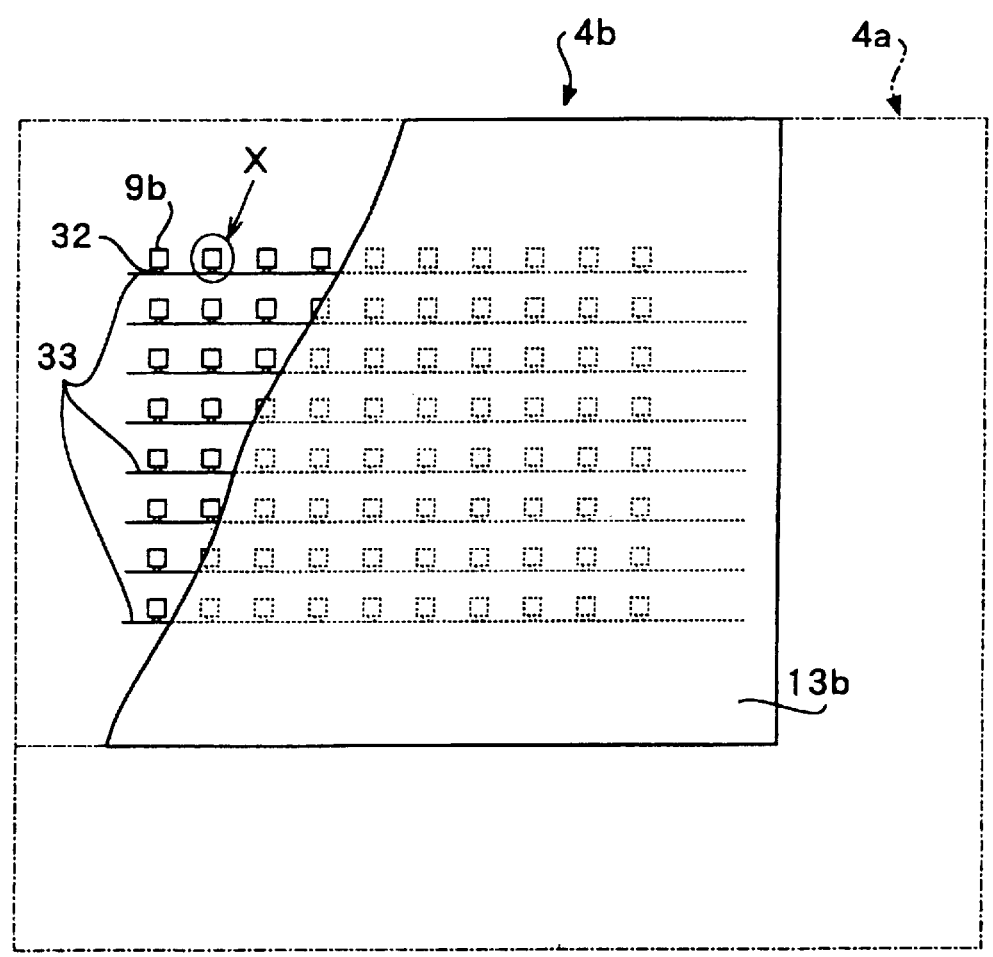
FIG. 9 is a plan view showing one substrate forming the liquid-crystal device shown in FIG. 7.

Referring to FIG. 9, the second substrate 4b of this embodiment includes a plurality of striped linear wiring lines 33 formed on the surface thereof facing the liquid crystal (on the back side of the second substrate 4b as shown FIG. 9) and TFDs (Thin Film Diodes) 32 as active elements arranged at regular intervals along each wiring line 33. The plurality of pixel electrodes 9b is connected to the wiring lines 33 through the TFDs 32, and generally arranged in a matrix.

Referring to FIG. 7, the first electrodes 9a and the pixel electrodes 9b overlap each other with the first substrate 4a and the second substrate 4b bonded together with the sealing member 6 interposed therebetween. One of the first electrode 9a and the pixel electrode 9b works as a scanning electrode, while the other of the first electrode 9a and the pixel electrode 9b works as a signal electrode.

A dot, which is the minimum unit for presenting an image such as characters and numerals, is formed of an overlap of a stripe of the first electrode 9a and a dot of the pixel electrode 9b. Three dots form a single pixel, and a matrix of pixels then forms a display area. In the above-mentioned color filter 17, the picture elements of red, green, and blue are arranged corresponding to the respective dots, and the three color dots of red, green, and blue form a single pixel.

Figure 10:
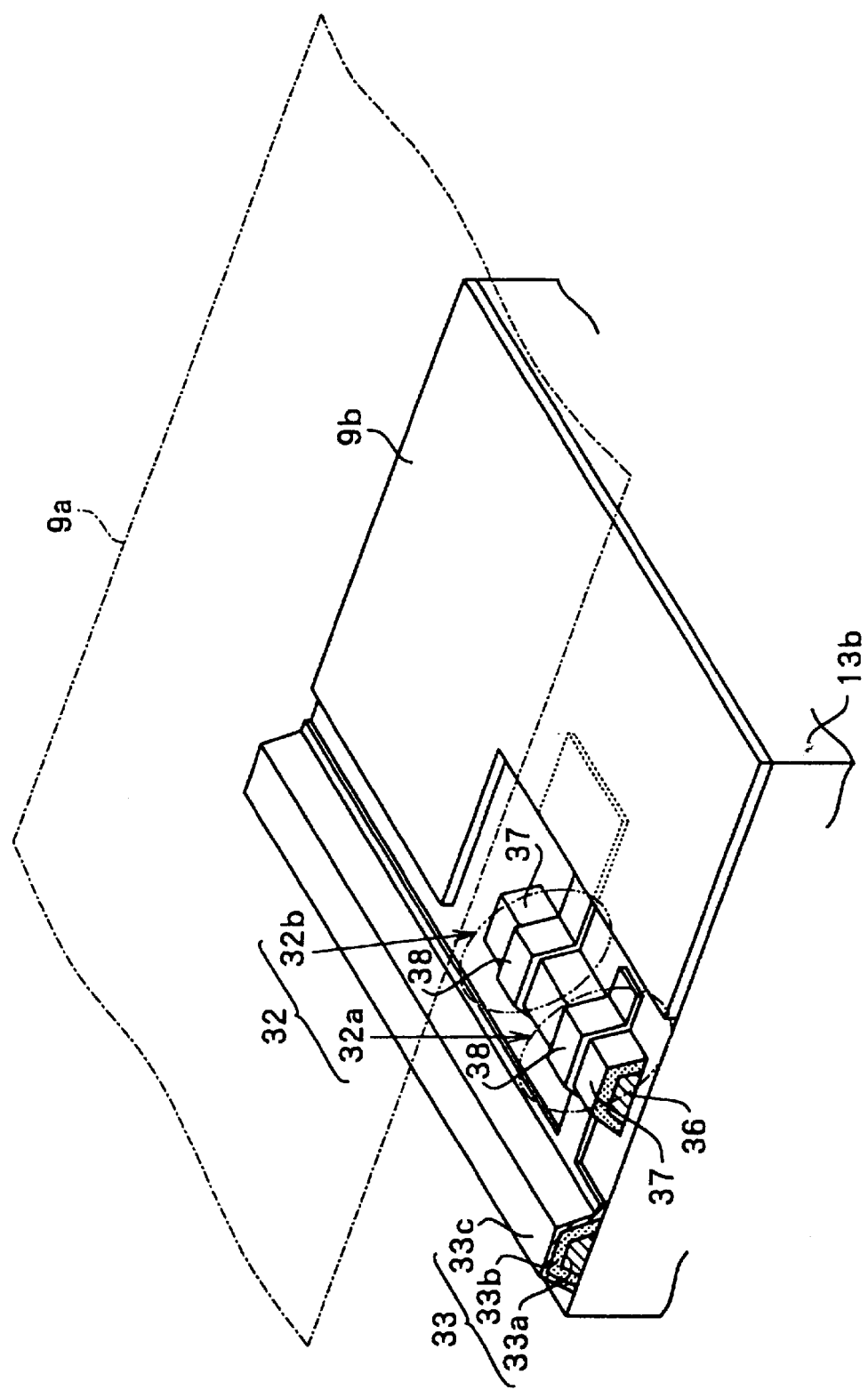
FIG. 10 is a perspective view showing one example of an active element used in the liquid-crystal device shown in FIG. 7.

FIG. 10 shows the construction of the TFD 32 and the periphery thereof. The TFD 32 shown in FIG. 10 is a TFD having a so-called back-to-back structure. As shown, the wiring line 33, for example, has a three-layer structure composed of a first layer 33a fabricated of TaW (tantalum-tungsten), a second layer 33b fabricated of $Ta_2O_5$ (tantalum oxide), and a third layer 33c fabricated of Cr.

Each of a first TFD element 32a and a second TFD element 32b forming the TFD 32 has a three-layer structure of a first metal layer 36 fabricated of TaW, an insulator layer 37 fabricated of $Ta_2O_5$ obtained through anodization, and a second metal layer 38 of Cr, which is the same as layer as that forming the third layer 33c of the wiring line 33.

The first TFD element 32a has a laminate structure that permits a current to flow from the wiring line 33 through the second metal layer 38, the insulator layer 37, and the first metal layer 36 in that order. On the other hand, the second TFD element 32b has a laminate structure that permits a current to flow from the wiring line 33 through the first metal layer 36, the insulator layer 37, and the second metal layer 38 in that order. The switching characteristic of the TFD element is stabilized by serially connecting the TFD elements 32a and 32b in electrically opposite directions in a back-to-back structure. The pixel electrode 9b is fabricated of the ITO, which is an electrically conductive, transparent material, so as to be connected to the second metal layer 38.

Referring to FIG. 7, when the first substrate 4a shown in FIG. 3 is bonded to the second substrate 4b shown in FIG. 9, the output lines 21b on the first substrate 4a are respectively connected to the wiring lines 33 on the second substrate 4b via the conductors 27. When the liquid-crystal driving IC 19b is mounted on the extension portion 8b, output terminals, namely, output bumps of the liquid-crystal driving IC 19b are respectively connected to the pixel electrodes 9b through the output lines 21b, the conductors 27, the wiring lines 33, and the TFDs 32. In this way, electrical conduction is thus assured between the first substrate 4a and the second substrate 4b. When the liquid-crystal driving IC 19a is mounted on the extension portion 8a, output terminals, namely, output bumps of the liquid-crystal driving IC 19a are respectively connected to the first electrodes 9a through the output line 21a.

In the liquid-crystal device 31 of this embodiment constructed as described above, light entering from outside the second substrate 4b, namely, from a viewer's side as shown in FIG. 8 is transmitted through the liquid-crystal layer L, reaches the APC layer including the first electrode 9a, namely, a reflective layer, is reflected from the reflective layer, is transmitted again through the liquid-crystal layer L, and then the second substrate 4b, and reaches the polarizer 14b.

Referring to FIG. 10, when a selection voltage potential for turning on the TFD 32 is applied to the first electrode 9a, the TFD 32 at an intersection of the first electrode 9a and the wiring line 33 is turned on regardless of the voltage potential supplied to the wiring line 33. The liquid crystal connected to the TFD 32, which is just turned on, stores a charge that is determined by a voltage difference between the selection voltage and a data voltage. The charge is maintained in the liquid crystal even when the TFD 32 is turned off with the first electrode 9a supplied with a deselection voltage after the charging of the liquid crystal.

Since the orientation of the liquid-crystal layer L changes depending on the charge stored in the liquid crystal, the quantity of light transmitted through the polarizer 14b (see FIG. 8) also changes in response to the stored charge. A display of predetermined gray scales is presented by controlling the amount of charge stored in the liquid crystal in response to the applied data voltage on a dot-by-dot basis.

Referring to FIG. 7, the surfaces of the output lines 21a and 21b and the input lines 28a and 28b may be contaminated in the course of the manufacturing process of the liquid-crystal device in this embodiment. If the insulator layer 11 is deposited on these lines, that contamination may be encapsulated below the insulator layer 11. With a voltage applied under such conditions, migration takes place when a large potential difference takes place between lines, particularly between adjacent lines. The lines are thus damaged, degrading the display quality of the device.

In contrast, in accordance with the present embodiment, the insulator layer 11 is formed clear of an area where a high-intensity electric field is applied, namely, an area between the power source line 22 and the ground line 23. In other words, no insulator layer 11 is arranged in the area between the power source line 22 and the ground line 23. Even if the power source line 22 or the like is contaminated in the manufacturing process in this arrangement, no contamination is encapsulated beneath the insulator layer 11. Even if a high-intensity electric field is applied between the lines during the driving of the liquid-crystal device, the generation of migration is controlled.

Figure 11:
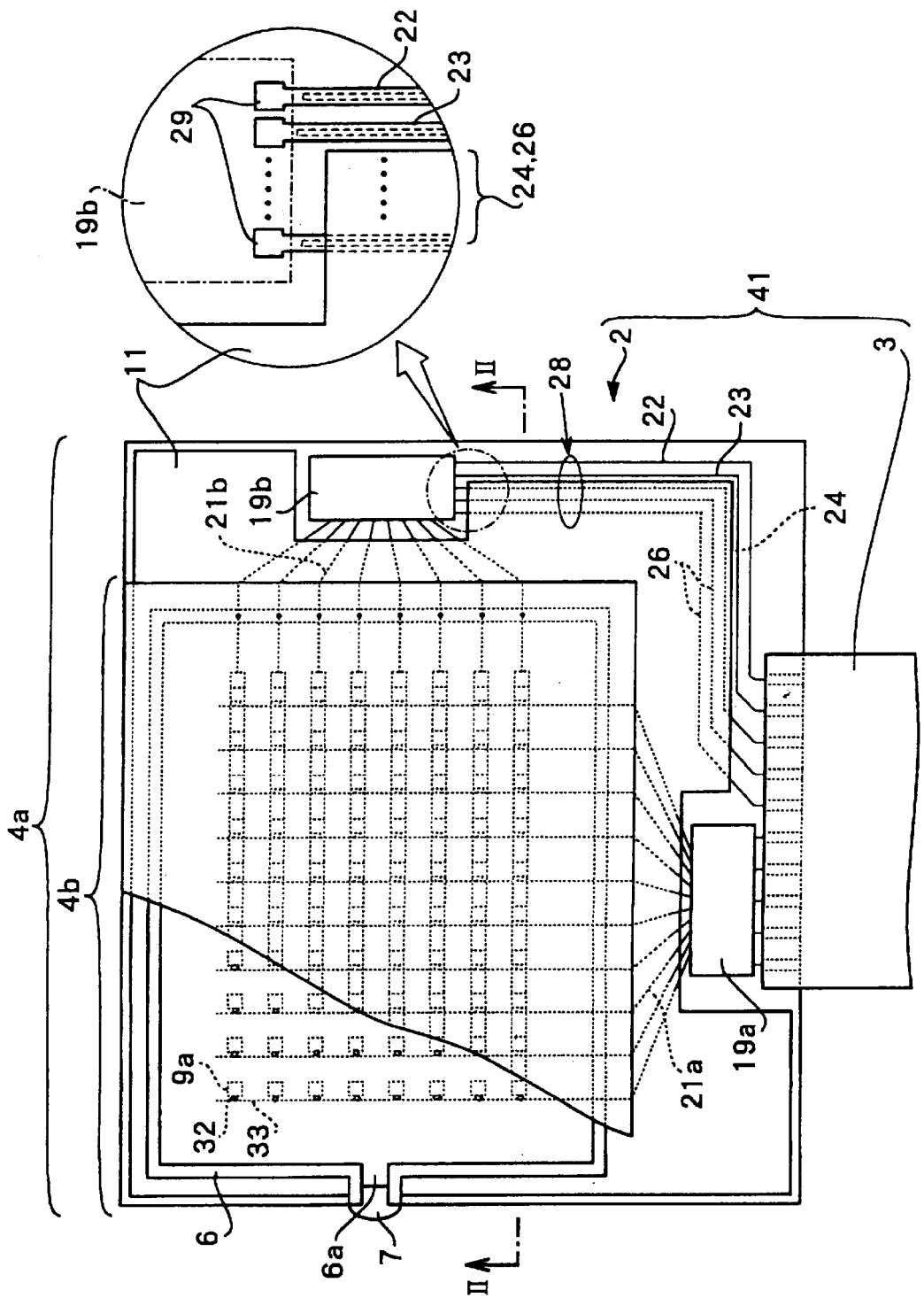
FIG. 11 is a plan view showing still another embodiment of the liquid-crystal device of the present invention.

FIG. 11 shows a fourth embodiment of the liquid-crystal device as an electrooptical device that incorporates a semiconductor chip mounting substrate of the present invention. Referring to FIG. 11, components identical to those described with reference to FIG. 1 are designated with the same reference numerals, and the discussion thereof is skipped.

Figure 12:
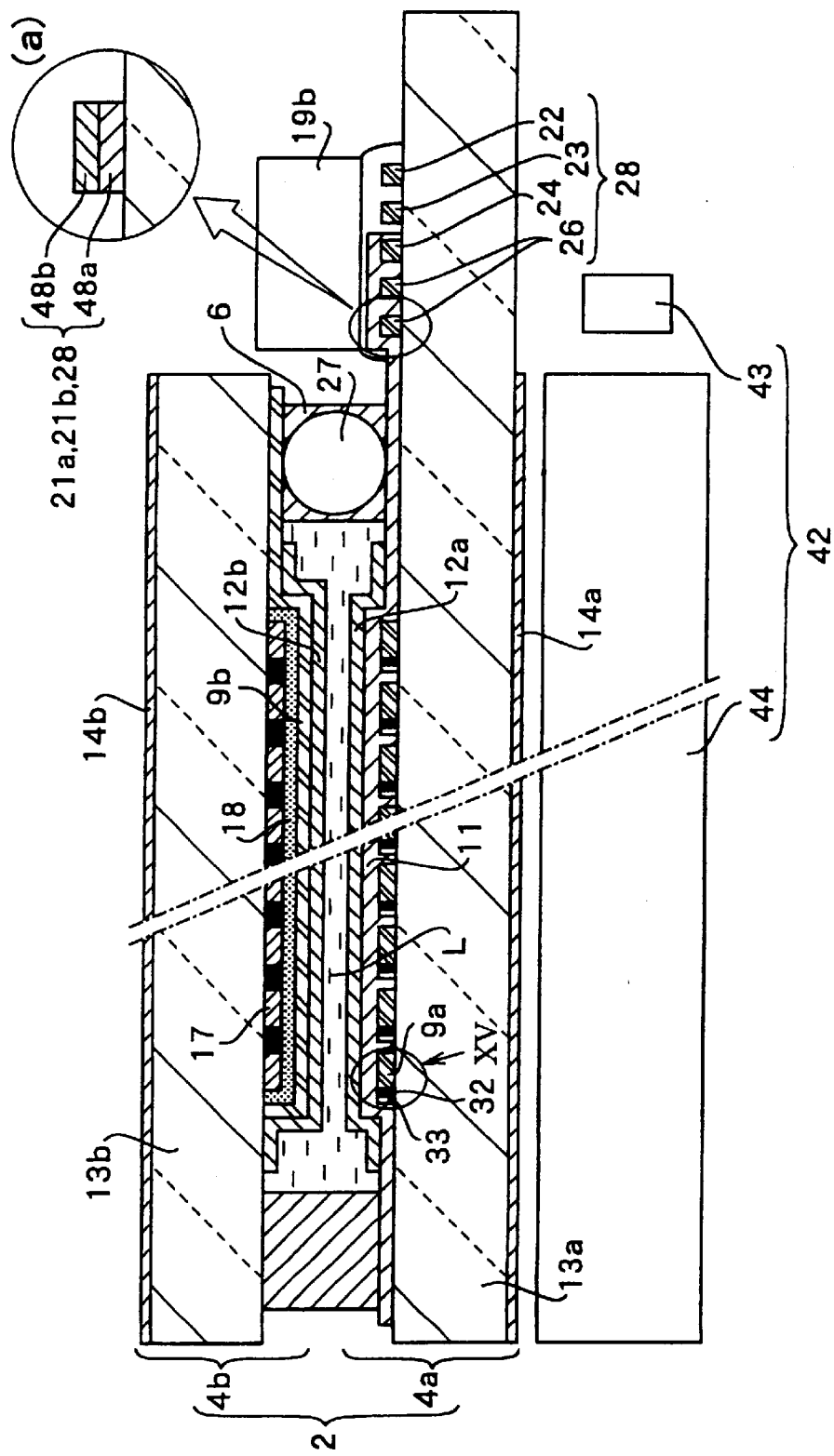
FIG. 12 is a cross-sectional view of the liquid-crystal device, taken along line II—II in FIG. 11.

A liquid-crystal device 41 is manufactured by connecting an external circuit board such as an FPC (Flexible Printed Circuit) 3 to an active-matrix liquid-crystal panel 2 that presents a color display on a transflective-type screen, and attaching an illumination unit 42 shown in FIG. 12 or other additional devices to the liquid-crystal panel 2.

Referring to FIG. 11, the liquid-crystal panel 2 is manufactured by bonding a first substrate 4a on the back side to a second substrate 4b on the front side with a annular sealing member 6 interposed therebetween. The sealing member 6 has an opening 6a through which a liquid crystal is introduced. A cell gap is formed between the first substrate 4a and the second substrate 4b bonded with the sealing member 6 interposed therebetween as shown in FIG. 12. The liquid crystal L is introduced into the cell gap through the opening 6a (see FIG. 1). After the liquid crystal L is introduced, the opening 6a is closed by a resin 7.

Referring to FIG. 12, the first substrate 4a includes a base structure 13a fabricated of glass, plastic, or the like. Wiring lines 33, TFDs 32, and pixel electrodes 9a are formed on the surface of the base structure 13a facing the liquid crystal (the top side of the base structure 13a as shown in FIG. 12), and an insulator layer 11 is deposited on these layers, and an alignment layer 12a is formed on the insulator layer 11. A polarizer 14a is glued onto the outer surface of the base structure 13a (the bottom side of the base structure 13a as shown in FIG. 12). The insulator layer 11 is fabricated of a silicon oxide. The alignment layer 12a is fabricated of polyimide, for example.

An illumination unit 42 includes a light source 43 such as an LED or a cold-cathode tube and a light guide 44 which converts light from the line light source to flat light. The illumination unit 42 is arranged external to the first substrate 4a, which is opposite to the viewer's side.

Optical elements other than those described above are arranged on both sides of the base structure 13a, as necessary. For example, a retardation layer may be arranged between the base structure 13a and the polarizer 14a, and an underlying layer is arranged between the base structure 13a and the pixel electrodes 9a.

Figure 13:
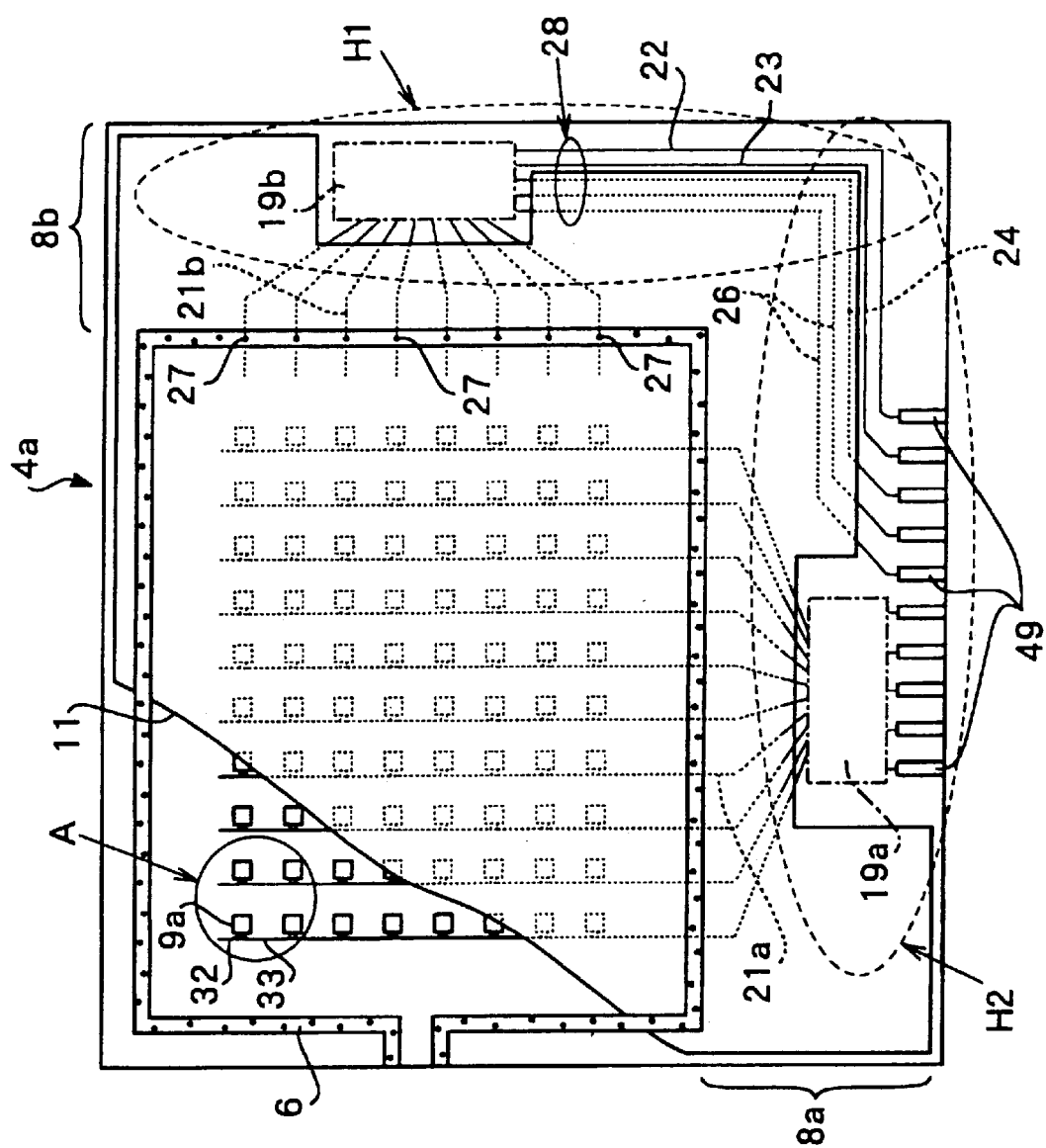
FIG. 13 is a plan view of one substrate forming the liquid-crystal device shown in FIG. 11.

Referring to FIG. 13, a plurality of striped linear wiring lines 33 are arranged side by side with spacings allowed therebetween in a generally striped configuration. TFDs (Thin Film Diodes) 32 as active elements arranged at regular intervals along each wiring line 33. The plurality of pixel electrodes 9a is connected to the wiring lines 33 through the TFDs 32, and generally arranged in a matrix.

Figure 14:
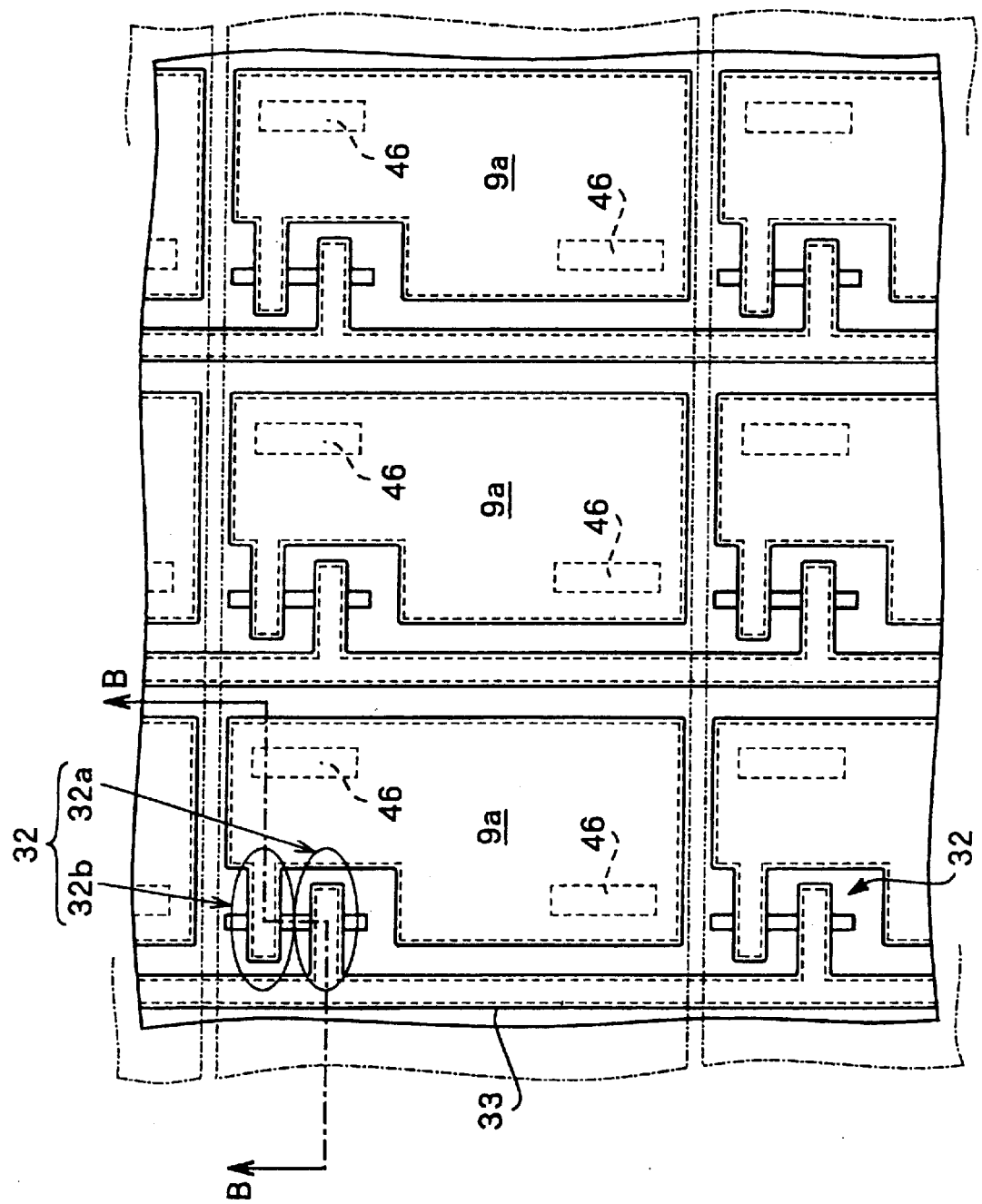
FIG. 14 shows in enlargement a portion indicated by an arrow A in FIG. 13.

FIG. 14 shows in enlargement a portion indicated by an arrow A in FIG. 13. As shown, the TFD 32 arranged between the wiring line 33 and the pixel electrode 9a has a back-to-back TFD structure in which a first TFD element 32a and a second TFD element 32b are serially connected. As shown in a cross-sectional view in FIG. 15 taken along line B—B in FIG. 14, the wiring line 33 has a three-layer structure composed of a first layer 33a fabricated of TaW (tantalum-tungsten), a second layer 33b fabricated of $Ta_2O_5$ (tantalum oxide), and a third layer 33c fabricated of the APC, which is a reflective alloy.

Each of the first TFD element 32a and the second TFD element 32b forming the TFD 32 has a three-layer structure of a first metal layer 36 fabricated of TaW, an insulator layer 37 fabricated of $Ta_2O_5$ obtained through anodization, and a second metal layer 38 of the APC, which is the same as layer as that forming the third layer 33c of the wiring line 33.

The first TFD element 32a has a laminate structure that permits a current to flow from the wiring line 33 through the second metal layer 38, the insulator layer 37, and the first metal layer 36 in that order. On the other hand, the second TFD element 32b has a laminate structure that permits a current to flow from the wiring line 33 through the first metal layer 36, the insulator layer 37, and the second metal layer 38 in that order. The switching characteristic of the TFD element is stabilized by serially connecting the TFD elements 32a and 32b in electrically opposite directions in a back-to-back structure.

Figure 15:
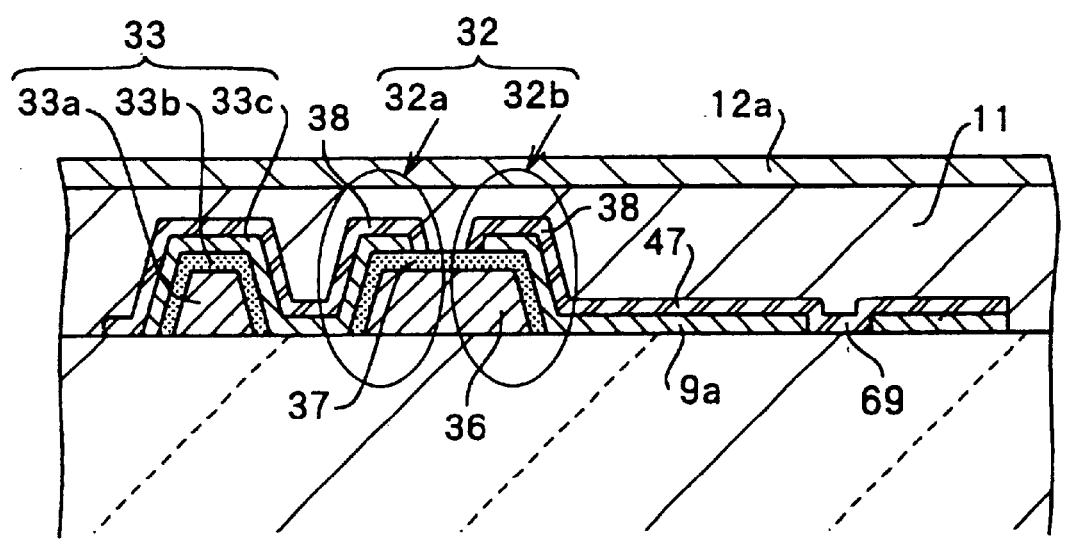
FIG. 15 is a cross-sectional view of the liquid-crystal device, taken along line B—B in FIG. 14.

The pixel electrode 9a is fabricated of the APC that also forms the second metal layer 38 of the second TFD element 32b. Referring to FIG. 14, apertures 46 for transmitting light therethrough are formed on two corners of the pixel electrode 9a located in a diagonal line thereof. As shown in FIG. 15, a protective layer 47 fabricated of the ITO, which is an electrically conductive, transparent layer, lies on the wiring lines 33, the TFDs 32 and the pixel electrodes 9a. The insulator layer 11, which is described with reference to FIG. 12, is deposited on the protective layer 47, and the alignment layer 12a then lies on the insulator layer 11.

Referring to FIG. 13, the insulator layer 11 is arranged beneath the sealing member 6 on the surface of the first substrate 4a facing the liquid crystal (i.e., on the front surface of the first substrate 4a in FIG. 13). Beneath the insulator layer 11 lie the wiring line 33, the TFD 32, and the pixel electrode 9a. Also arranged are the output lines 21a for the liquid-crystal driving IC 19a, the output lines 21b for the liquid-crystal driving IC 19b, and the input lines 28 for the liquid-crystal driving IC 19b. The input lines 28 includes a variety of lines such as the power source line 22, the ground line 23, the control line 24, and the data line 26. Since the liquid-crystal driving IC 19a is mounted close to terminals 49, input lines therefor are very short.

In this embodiment as well, the insulator layer 11 covers the pixel electrodes 9a, the output lines 21a and 21b, and the input lines 28a and 28b, thereby protecting them from damage. Rather than fully covering all the electrodes and lines, the insulator layer 11 is formed clear of the area between the power source line 22 and the ground line 23 as shown in FIG. 3(a), FIG. 1(a), and FIG. 5.

The output lines 21a respectively extend from the wiring line 33, are routed through the sealing member 6, and then reach the extension portion 8a. The output lines 21b are routed through the sealing member 6, with ends thereof reaching the area enclosed by the sealing member 6, namely, the liquid-crystal encapsulated area, and with the other ends extending to the extension portion 8b of the first substrate 4a. The sealing member 6 contains spherical or cylindrical conductors 27 dispersed therewithin.

Each of the output lines 21a and 21b and the input lines 28 has a bilayer structure made of a first layer 48a and a second layer 48b as shown in FIG. 12(a). The first layer 48a is manufactured of the APC at the same time when the third film 33c of the wiring line 33, the second metal layer 38 of the TFD 32, and the pixel electrodes 9a are manufactured of the APC as shown in FIG. 15. The second layer 48b shown in FIG. 12(a) is manufactured of the ITO at the same time when the protective layer 47 is manufactured of the same ITO as shown in FIG. 15. The lines are manufactured of the APC in this way, resulting in a low electrical resistance thereof. By covering the lines with the ITO, the APC is protected.

The liquid-crystal driving IC 19b is designed to be mounted on a first side portion H1 of the first substrate 4a, and the other liquid-crystal driving IC 19a is designed to be mounted on a second side portion H2 of the first substrate 4a intersecting, more specifically, aligned approximately perpendicular to the first side portion H1. In this embodiment, the terminals 49 for external connections are formed almost at the center of the second side portion H2, and the input lines 28 for the liquid-crystal driving IC 19b on the first side portion 1H runs along a long path straddling from the first side portion 1H to the second side portion 2H.

The second substrate 4b shown in FIG. 12 has a construction similar to that of the second substrate 4b shown in FIG. 2. The discussion of the second substrate 4b made with reference to FIG. 2 is not repeated here and is referred back to as necessarily.

The liquid-crystal device 41 of this embodiment applies light in one of two methods: a reflective method and a transmissive method. When the reflective method is used as shown in FIG. 12, light entering from outside the second substrate 4b, namely, from the viewer's side, is transmitted through the liquid-crystal layer L, reaches the pixel electrode 9a including the APC layer, namely a reflective layer, is reflected from the reflective layer, and is fed back to the liquid-crystal layer L.

When the transmissive method is used, the light source 43 of the illumination unit 42 emits light, the light guide 44 converts light into flat light and feeds the flat light to the liquid-crystal panel 2. The light thus supplied is transmitted through the base structure 13a, the apertures 46 of the pixel electrode 9a (see FIG. 14), the insulator layer 11, and the alignment layer 12a, and then reaches the liquid-crystal layer L.

Referring to FIG. 11, the TFDs 32 are controlled by the liquid-crystal driving IC 19a and the liquid-crystal driving IC 19b on a dot-by-dot basis. The amount of charge stored in the liquid crystal is thus controlled, and therefore the orientation of the liquid-crystal L present in each dot is controlled on a dot-by-dot basis. During each of the reflective displaying and the transmissive displaying, light fed to the liquid-crystal layer L is modulated pixel by pixel, thereby presenting an image such as characters on the outer surface of the second substrate 4b of FIG. 12.

In this embodiment as shown in FIG. 11, the surfaces of the output lines 21a and 21b and the input lines 28 may be contaminated in the course of the manufacturing process of the liquid-crystal device. If the insulator layer 11 is deposited on these lines, that contamination may be encapsulated below the insulator layer 11. With a voltage applied under such conditions, migration takes place when a large potential difference takes place between lines, particularly between adjacent lines. The lines are thus damaged, degrading the display quality of the device.

In contrast, in accordance with the present embodiment, the insulator layer 11 is formed clear of an area where a high-intensity electric field is applied, namely, an area between the power source line 22 and the ground line 23. In other words, no insulator layer 11 is arranged in the area between the power source line 22 and the ground line 23. Even if the power source line 22 or the like is contaminated in the manufacturing process in this arrangement, no contamination is encapsulated beneath the insulator layer 11. Even if a high-intensity electric field is applied between the lines during the driving of the liquid-crystal device, the generation of migration is controlled.

In this embodiment as shown FIG. 13, the power source line 22 and the ground line 23 runs straddling the first side portion H1 and the second side portion H2, and as a result the length of the path of these lines becomes long. When the lines become long, migration is more likely to take place in comparison with when the lines are short as shown in FIG. 1 and FIG. 7. With the present invention implemented, the insulator layer 11 is arranged clear of the area between the power source line 22 and the ground line 23, the generation of migration is reliably avoided.

Figure 16:
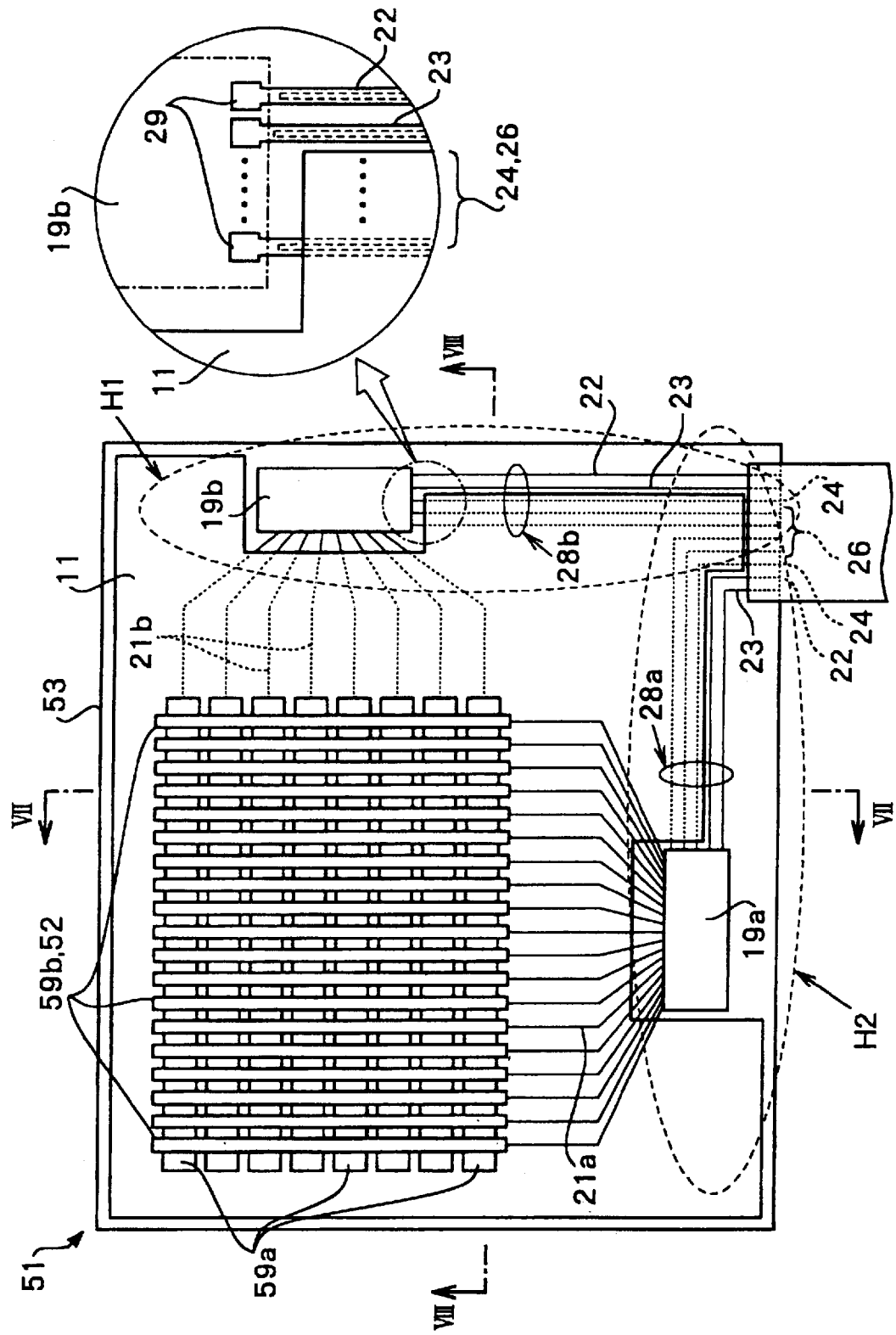
FIG. 16 is a plan view showing one embodiment of the electroluminescent device of the present invention.
Figure 17:
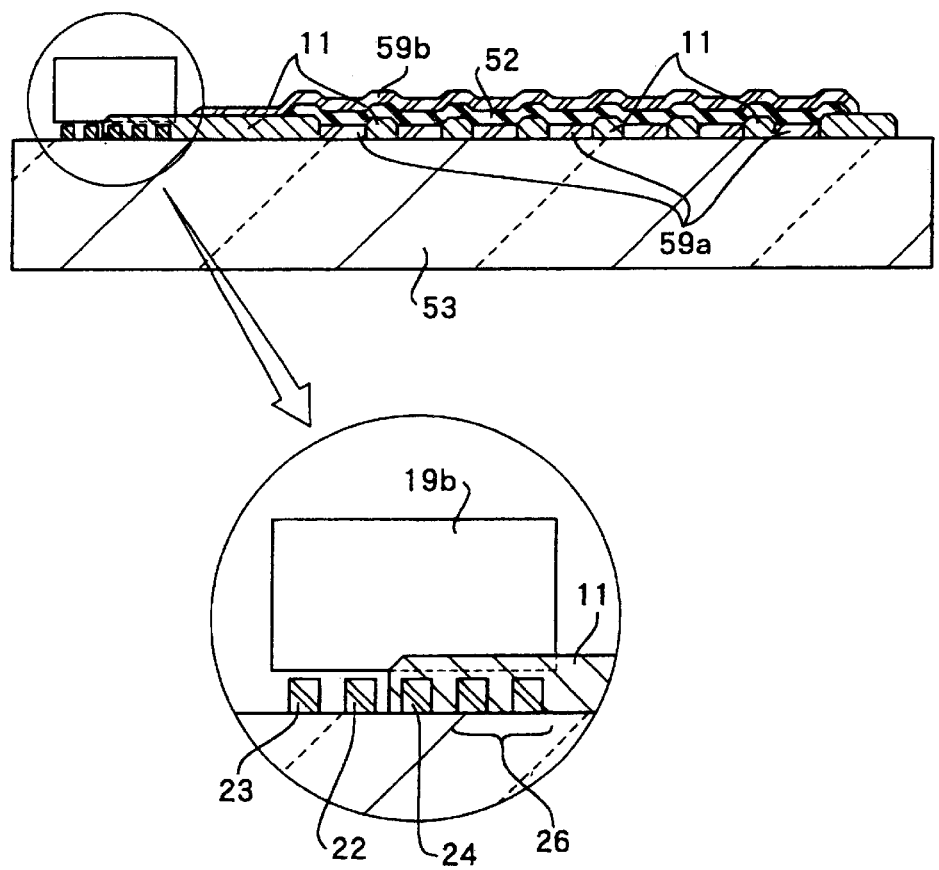
FIG. 17 is a cross-sectional view of the electroluminescent device, taken along line VII—VII in FIG. 16.

FIG. 16 shows a fifth embodiment of an electroluminescent device as an electrooptical device that incorporates a semiconductor chip mounting substrate of the present invention. As shown in a cross-sectional view in FIG. 17, taken along line VII—VII in FIG. 16, an electroluminescent device 51 includes an anode 59 as a first electrode formed on a base structure 53, namely, a plurality of anodes 59a arranged side by side with spacings maintained therebetween, an insulator layer 11 formed between the anodes 59a, an organic electroluminescent emission layer 52 lying on the insulator layer 11 and the anodes 59a, and cathodes 59b formed on the organic electroluminescent emission layer 52 and serving as a second electrode.

Figure 18:
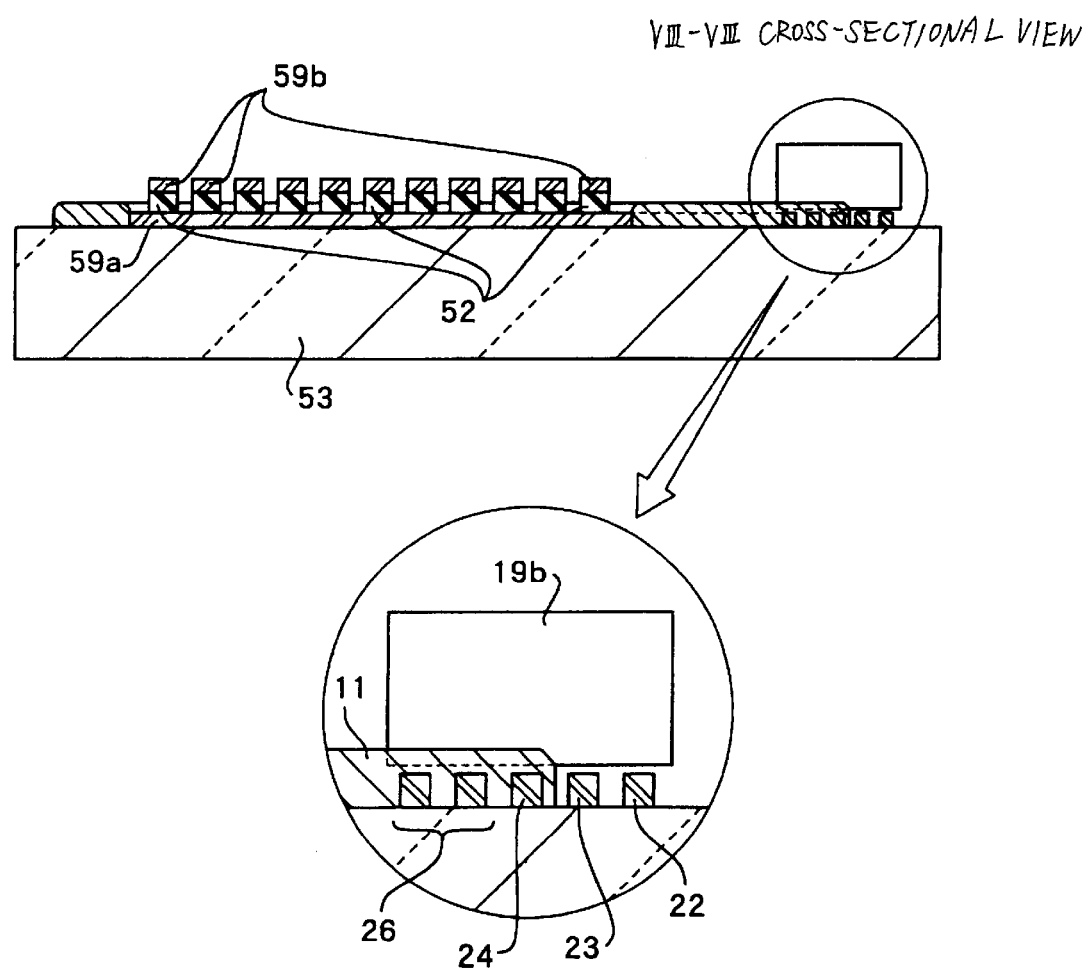
FIG. 18 is a cross-sectional view of the electroluminescent device, taken along line VIII—VIII in FIG. 16.

Referring to FIG. 16, the plurality of anodes 59a is arranged to run in parallel with the spacings maintained therebetween in a generally striped configuration. The plurality of cathodes 59b is also arranged to run in parallel with spacings maintained therebetween in a generally striped configuration and in a direction generally perpendicular to the anodes 59a. As seen from FIG. 18, which is a cross-sectional view of the electroluminescent device 51 taken along line VIII—VIII in FIG. 16, the organic electroluminescent emission layer 52 is formed in almost the same location as that of the cathode 59b.

As is well known, the organic electroluminescent emission layer 52 emits light of characteristic color when a predetermined voltage is applied to electrodes sandwiching the organic electroluminescent emission layer 52. In this embodiment, three types of electroluminescent elements, one emitting red light, one emitting green light, and the third emitting blue light, are arranged adjacent to each other in a single unit, and these units are arranged in the direction of length of the anode 59a. Each region where the three organic electroluminescent emission layers 52 of the three colors of red, green, and blue intersect the anode 59a constitutes a single pixel. These pixels are arranged in a matrix, thereby forming a display area.

Referring to FIG. 16, the liquid-crystal driving IC 19b is mounted on a first side portion H1 of the base structure 53, and the liquid-crystal driving IC 19a is mounted on a second side portion 2H of the base structure 53, the edge of the second side portion intersecting the edge of the first side portion. A circuit board to establish an electrical connection with an external circuit, for example, an FPC 3, is attached to one corner of the base structure 53. The output bumps of the liquid-crystal driving IC 19a are respectively connected to the cathodes 59b through the output lines 21a, and the output bumps of the liquid-crystal driving IC 19b are respectively connected to the anodes 59a through the output lines 21b.

The input lines 28a connects the liquid-crystal driving IC 19a to the FPC 3, and the input lines 28b connects the liquid-crystal driving IC 19b to the FPC 3. The input lines 28a and 28b respectively include the power source line 22, the ground line 23, the control line 24, and the data line 26. Each of the output lines 21a and 21b and the input lines 28a and 28b includes the APC, thereby presenting a low electrical resistance. The presentation operation of the device is stably and reliably performed.

In this embodiment as well, the insulator layer 11 assures insulation between the plurality of anodes 59a while covering the output lines 21b, and the input lines 28a and 28b, thereby protecting them from damage. Rather than fully covering all the electrodes and lines, the insulator layer 11 is formed clear of the area between the power source line 22 and the ground line 23.

The electroluminescent device 51 thus constructed controls the voltage applied to the organic electroluminescent emission layer 52 on a dot-by-dot basis, thereby allowing the organic electroluminescent emission layer 52 at desired coordinates to emit light in a desired color. Based on additive coloration, an image such as characters and drawings is presented in a desired color.

In this embodiment, the insulator layer 11 is formed clear of an area where a high-intensity electric field is applied, namely, an area between the power source line 22 and the ground line 23. In other words, no insulator layer 11 is arranged in the area between the power source line 22 and the ground line 23. Even if the power source line 22 or the like is contaminated during the manufacturing process of the electroluminescent device, no contamination is encapsulated beneath the insulator layer 11. Even if a high-intensity electric field is applied between the lines during the driving of the liquid-crystal device, the generation of migration is controlled.

Figure 19:
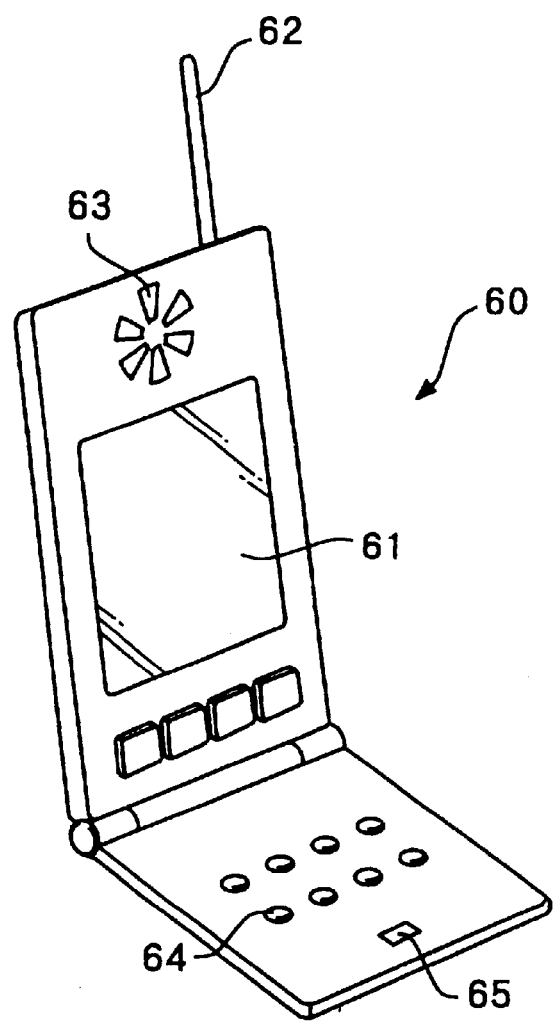
FIG. 19 shows an embodiment of a mobile telephone as one example of electronic equipment of the present invention.

FIG. 19 shows one embodiment of a mobile telephone 60 as one example of electronic equipment of the present invention. The mobile telephone 60 includes a display unit 61 incorporating an electrooptical device such as a liquid-crystal device or an organic electroluminescent device, an antenna 62, a loudspeaker 63, a key switch bank 64, and a microphone 65. The electrooptical device 61 as the display unit may incorporate one of the liquid-crystal devices shown in FIG. 1, FIG. 7, and FIG. 1, or the electroluminescent device shown in FIG. 16.

Figure 20:
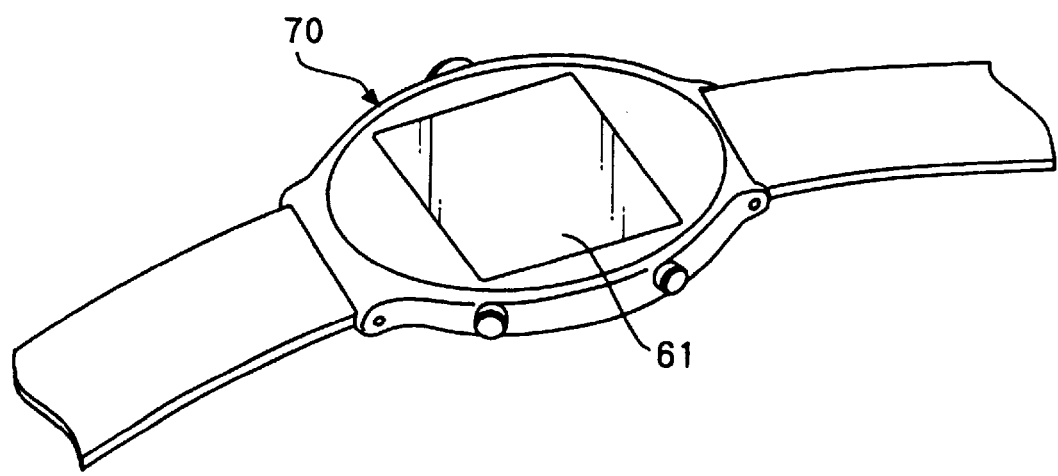
FIG. 20 shows an embodiment of a wristwatch as another example of the electronic equipment of the present invention.

FIG. 20 shows one embodiment of a wristwatch as another example of the electronic equipment of the present invention. The wristwatch 70 includes an electrooptical device 61 as a display unit thereof. The electrooptical device 61 as the display unit may incorporate one of the liquid-crystal devices shown in FIG. 1, FIG. 7, and FIG. 11, or the electroluminescent device shown in FIG. 16.

Figure 21:
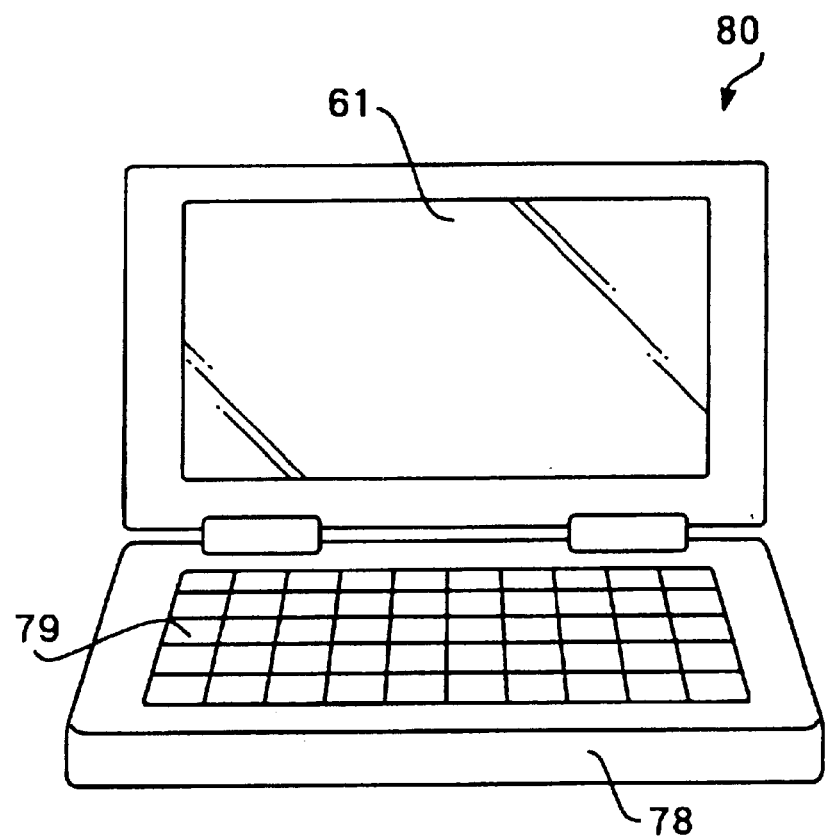
FIG. 21 shows an embodiment of a mobile information terminal as yet another example of the electronic equipment of the present invention.

FIG. 21 shows one embodiment of a mobile information terminal as another example of the electronic equipment of the present invention. The mobile information terminal 80 can be a word processor, a personal computer, or the like. The mobile information terminal 80 includes an input unit 79 such as a keyboard arranged on a main unit 78, and an electrooptical device 61 as a display unit.

A processor built in the main unit 78 processes information input by the keyboard 79, performs processes in response to the input information, and displays results on the electrooptical device 61.

In accordance with the present invention, the insulator layer is formed clear of the area between the power source line and the ground line. In other words, no insulator layer is arranged between the power source line and the ground line. In this arrangement, contamination is not encapsulated by the insulator layer even if the lines in the supply voltage system are contaminated during the manufacturing process of the semiconductor chip mounting substrate, the liquid-crystal device, etc. Migration is thus prevented from being generated even when a high-voltage is applied during driving of the semiconductor chip mounting substrate, etc.

The entire disclosure of Japanese Patent Application No. 2000-365715 filed Nov. 30, 2000 and Japanese Patent Application No. 2001-317142 filed Oct. 15, 2001 is incorporated by reference herein.

What is claimed is:

1. An electrooptical device having an electrooptical layer, comprising:

a substrate supporting the electrooptical layer;

an electrode driving the electrooptical layer;

a driving element mounted on the substrate;

an output line connected to the driving element and supplying an output signal output from the driving element to the electrode;

an insulator layer covering the output line;

a power source line formed on the substrate and supplying a supply voltage potential to the driving element, and a ground line formed on the substrate and supplying a ground voltage potential to the driving element;

wherein the insulator layer is formed clear of an area between the power source line and the ground line.

2. An electrooptical device according to claim 1, wherein the power source line comprises a layer containing a metal as a major composition thereof.

3. An electrooptical device according to claim 2, wherein the layer containing the metal as the major composition thereof contains a metal selected from the group consisting of silver, palladium, and copper.

4. An electrooptical device according to claim 2, wherein at least one of the power source line and the ground line comprises a laminate structure formed of a metal and a metal oxide.

5. An electrooptical device according to claim 3, wherein the electrooptical layer is selected from an organic electroluminescent layer and a liquid-crystal layer.

6. An electrooptical device according to claim 2, wherein the electrooptical layer is sandwiched between the electrode and a second electrode; and
   wherein one of the electrode and the second electrode is connected to a switching element.

7. An electrooptical device according to claim 6, wherein the switching element is selected from a thin-film transistor and a thin-film diode.

8. An electrooptical device according to claim 2, further comprising a second electrode driving the electrooptical layer; and
   wherein the electrooptical layer is sandwiched between the electrode and the second electrode, and comprises:
   a second driving element mounted on the substrate;
   an insulator layer covering the output line;
   a second power source line formed on the substrate and supplying a supply voltage potential to the second driving element; and
   a second ground line formed on the substrate and supplying a ground voltage potential to the second driving element; and
   wherein the insulator layer is formed clear of an area between the second power source line and the second ground line.

9. An electrooptical device having an electrooptical layer, comprising:
   a substrate supporting the electrooptical layer;
   an electrode driving the electrooptical layer;
   a driving element mounted on the substrate;
   an output line connected to the driving element and supplying an output signal output from the driving element to the electrode;
   an insulator layer covering the output line;
   a power source line formed on the substrate and supplying a supply voltage potential to the driving element;
   a ground line formed on the substrate and supplying a ground voltage potential to the driving element;
   a control line formed on the substrate and supplying a control signal to control the driving element; and
   a data line formed on the substrate and supplying a data signal to the driving element;
   wherein the insulator layer is formed clear of one of a first area between the power source line and the control line, a second area between the power source line and the data line, a third area between the ground line and the control line, and a fourth area between the ground line and the data line.

10. Electronic equipment comprising as a display unit thereof an electrooptical device according to claim 1.

* * * * *

UNITED STATES PATENT AND TRADEMARK OFFICE
CERTIFICATE OF CORRECTION

PATENT NO. : 6,809,390 B2
DATED : October 26, 2004
INVENTOR(S) : Takatomo Toda and Naoki Makino It is certified that error appears in the above-identified patent and that said Letters Patent is hereby corrected as shown below:

Title Page, Item [54] and Column 1, lines 1-5,
Title, should be -- ELECTROOPTICAL DEVICE --.

Column 1,
Line 22, after "such" insert -- as --.

Column 3,
Line 1, after "according" insert -- to --.

Column 4,
Line 39, "an" should be -- a --.

Column 10,
Line 24, "a" should be -- an --.

Column 14,
Line 46, "a" should be -- an --.

Column 15,
Line 55, after "shown" insert -- in --.

Column 17,
Line 50, "a" should be -- an --.

UNITED STATES PATENT AND TRADEMARK OFFICE
CERTIFICATE OF CORRECTION

PATENT NO. : 6,809,390 B2
DATED : October 26, 2004
INVENTOR(S) : Takatomo Toda and Naoki Makino It is certified that error appears in the above-identified patent and that said Letters Patent is hereby corrected as shown below:

Column 19,
Line 47, "1H" should be -- H1 --.
Line 48, "1H" should be -- H1 --.
Line 48, "2H" should be -- H2 --.

Column 20,
Line 37, after "shown" insert -- in --.

Column 21,
Line 20, "2H" should be -- H2 --.

Column 22,
Line 7, $2^{nd}$ occurrence of "FIG. 1" should be -- FIG. 11 --.

Column 24,
Line 27, after claim 10, insert claims 11 and 12 as follows:

-- 11. An electrooptical device having an electrooptical layer, comprising:
   a substrate for supporting the electrooptical layer;
   an electrode driving the electrooptical layer;
   a driving element mounted on the substrate;
   an output line connected to the driving element and supplying an output signal output from the driving element to the electrode;
   a plurality of input lines connected to the driving element;
   an insulator layer covering the output line and part of the input lines;
   a power source line formed on the substrate and supplying a supply voltage potential to the driving element; and
   a ground line formed on the substrate and supplying a ground voltage potential to the driving element;
   wherein the input lines comprise the power source line and the ground line, and
   wherein the insulator layer is formed clear of an area between the power source line and the ground line. --.

UNITED STATES PATENT AND TRADEMARK OFFICE
CERTIFICATE OF CORRECTION

PATENT NO. : 6,809,390 B2
DATED : October 26, 2004
INVENTOR(S) : Takatomo Toda and Naoki Makino It is certified that error appears in the above-identified patent and that said Letters Patent is hereby corrected as shown below:

Column 24 (cont'd),

-- 12. An electrooptical device having an electrooptical layer, comprising:
a substrate for supporting the electrooptical layer;
an electrode for driving the electrooptical layer;
a driving element mounted on the substrate;
an output line, connected to the driving element, for supplying an output signal output from the driving element to the electrode;
a plurality of input lines connected to the driving element;
an insulator layer for covering the output line and part of the input lines;
a power source line, formed on the substrate, for supplying a supplying voltage to the driving element;
a ground line, formed on the substrate, for supplying a ground voltage to the driving element;
a control line, formed on the substrate, for supplying a control signal to control the driving element, and
a data line, formed on the substrate, for supplying a data signal to the driving element;
wherein the input lines comprise the power source line and the ground line; and
wherein the insulator layer is formed clear of one of an area between the power source line and the control line, an area between the power source line and the data line, an area between the ground line and the control line, and an area between the ground line and the data line. --.

Signed and Sealed this

Thirtieth Day of August, 2005

JON W. DUDAS
*Director of the United States Patent and Trademark Office*